United States Patent
Lee et al.

(10) Patent No.: US 7,661,055 B2
(45) Date of Patent: *Feb. 9, 2010

(54) PARTIAL-PARALLEL IMPLEMENTATION OF LDPC (LOW DENSITY PARITY CHECK) DECODERS

(75) Inventors: Tak K. Lee, Irvine, CA (US); Hau Thien Tran, Irvine, CA (US); Ba-Zhong Shen, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 831 days.

This patent is subject to a terminal disclaimer.

(21) Appl. No.: 11/323,901

(22) Filed: Dec. 30, 2005

(65) Prior Publication Data

US 2007/0127387 A1    Jun. 7, 2007

Related U.S. Application Data

(60) Provisional application No. 60/742,404, filed on Dec. 5, 2005.

(51) Int. Cl.
*H03M 13/00*    (2006.01)
(52) U.S. Cl. .................................. 714/752; 714/780
(58) Field of Classification Search ................. 714/780, 714/752
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 6,938,196 B2* | 8/2005 | Richardson et al. | 714/752 |
| 6,957,375 B2* | 10/2005 | Richardson | 714/752 |
| 7,246,304 B2* | 7/2007 | Kim | 714/801 |
| 7,299,397 B2* | 11/2007 | Yokokawa et al. | 714/752 |
| 7,401,283 B2* | 7/2008 | Shen et al. | 714/758 |
| 7,415,079 B2* | 8/2008 | Cameron et al. | 375/340 |
| 7,454,685 B2* | 11/2008 | Kim et al. | 714/758 |
| 2003/0104788 A1 | 6/2003 | Kim | |
| 2005/0149844 A1* | 7/2005 | Tran et al. | 714/800 |

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—M. Mujtaba K Chaudry
(74) *Attorney, Agent, or Firm*—Garlick Harrison & Markison; Shayne X. Short

(57) ABSTRACT

Partial-parallel implementation of LDPC (Low Density Parity Check) decoder. A novel approach is presented by which a selected number of cycles is performed during each of bit node processing and check node processing when performing error correction decoding of an LDPC coded signal. The number of cycles of each of bit node processing and check node processing need not be the same. At least one functional block, component, portion of hardware, or calculation can be used during both of the bit node processing and check node processing thereby conserving space with an efficient use of processing resources. At a minimum, a semi-parallel approach can be performed where 2 cycles are performed during each of bit node processing and check node processing. Alternatively, more than 2 cycles can be performed for each of bit node processing and check node processing.

20 Claims, 20 Drawing Sheets

U.S. PATENT DOCUMENTS

2005/0262420 A1* 11/2005 Park et al. .................. 714/758
2006/0107179 A1* 5/2006 Shen et al. .................. 714/758
2006/0274772 A1* 12/2006 Kim et al. .................. 370/412

OTHER PUBLICATIONS

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 147, No. 2, pp. 599-618, Feb. 2001.

* cited by examiner

PARTIAL-PARALLEL IMPLEMENTATION OF LDPC (LOW DENSITY PARITY CHECK) DECODERS

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/742,404, entitled "Partial-parallel implementation of LDPC (Low Density Parity Check) decoder," filed Monday, Dec. 5, 2005.

BACKGROUND OF THE INVENTION

1. Technical Field of the Invention

The invention relates generally to communication systems; and, more particularly, it relates to decoding signals employed within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3 an (10 GBASE-T) emerging standard) as well as communication systems operating within a wireless context (e.g., in the IEEE 802.11 context space including the IEEE 802.11 an emerging standard).

For any of these particular communication system application areas, near-capacity achieving error correction codes are very desirable. The latency constraints, which would be involved by using traditional concatenated codes, simply preclude their use in such applications in very high data rate communication system application areas.

When performing decoding processing of such LDPC signals within communication systems, a designer has quite a degree of freedom by which to implement the hardware to perform such decoding. By selecting a particular topological arrangement (in terms of hardware and processing resources) for implementing an LDPC code decoder. Depending on the particular design parameters desired to be optimized, a designer can select a particular decoder design to meet any one or more of various design objectives including meeting desired levels of area, time, and power that are required to decode such LDPC signals effectively and to an acceptable degree of performance for a given application. There seems continual to be a need in the art for more and better designs to allow a hardware device designer to select a particular arrangement to meet the particular needs of a particular application.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
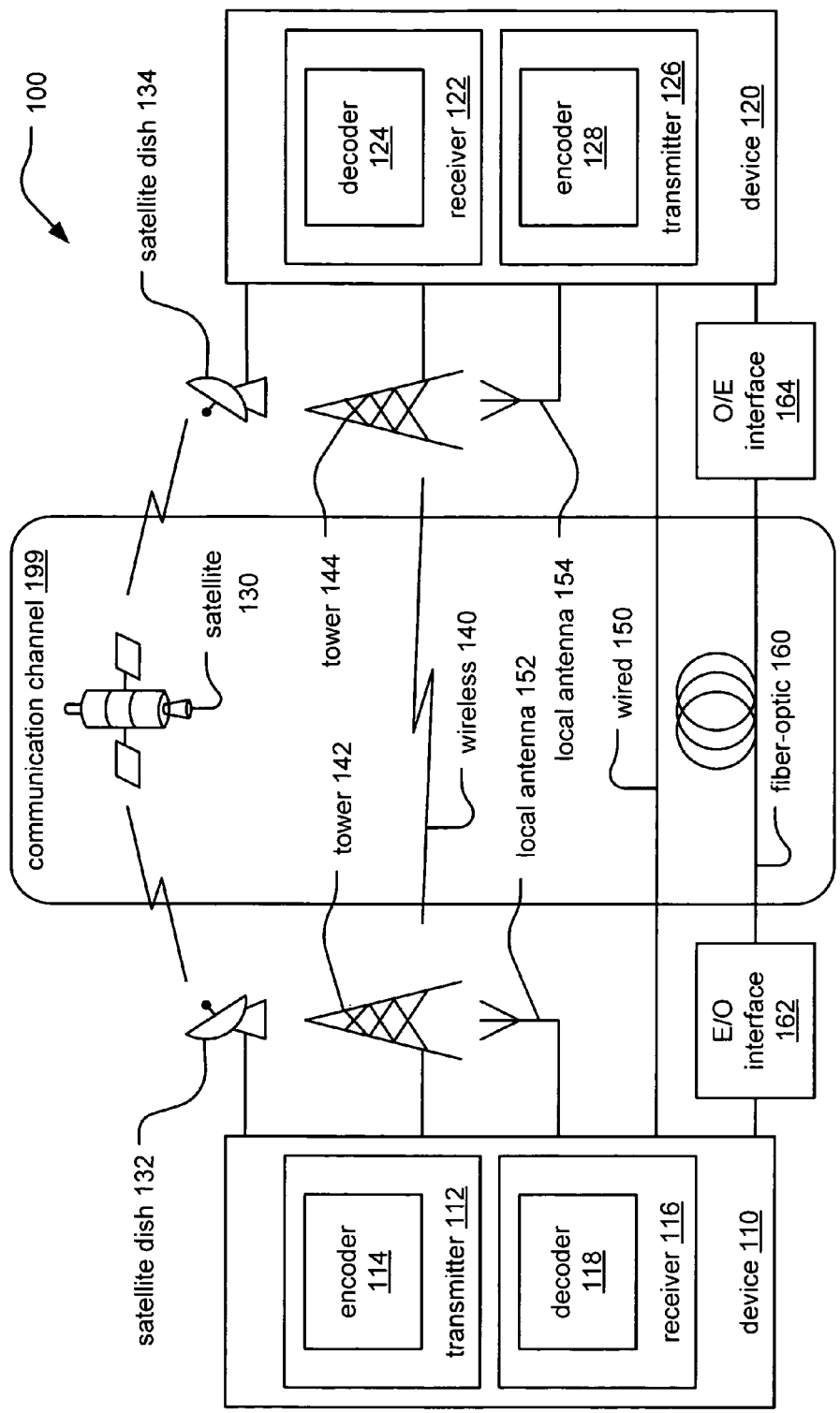
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
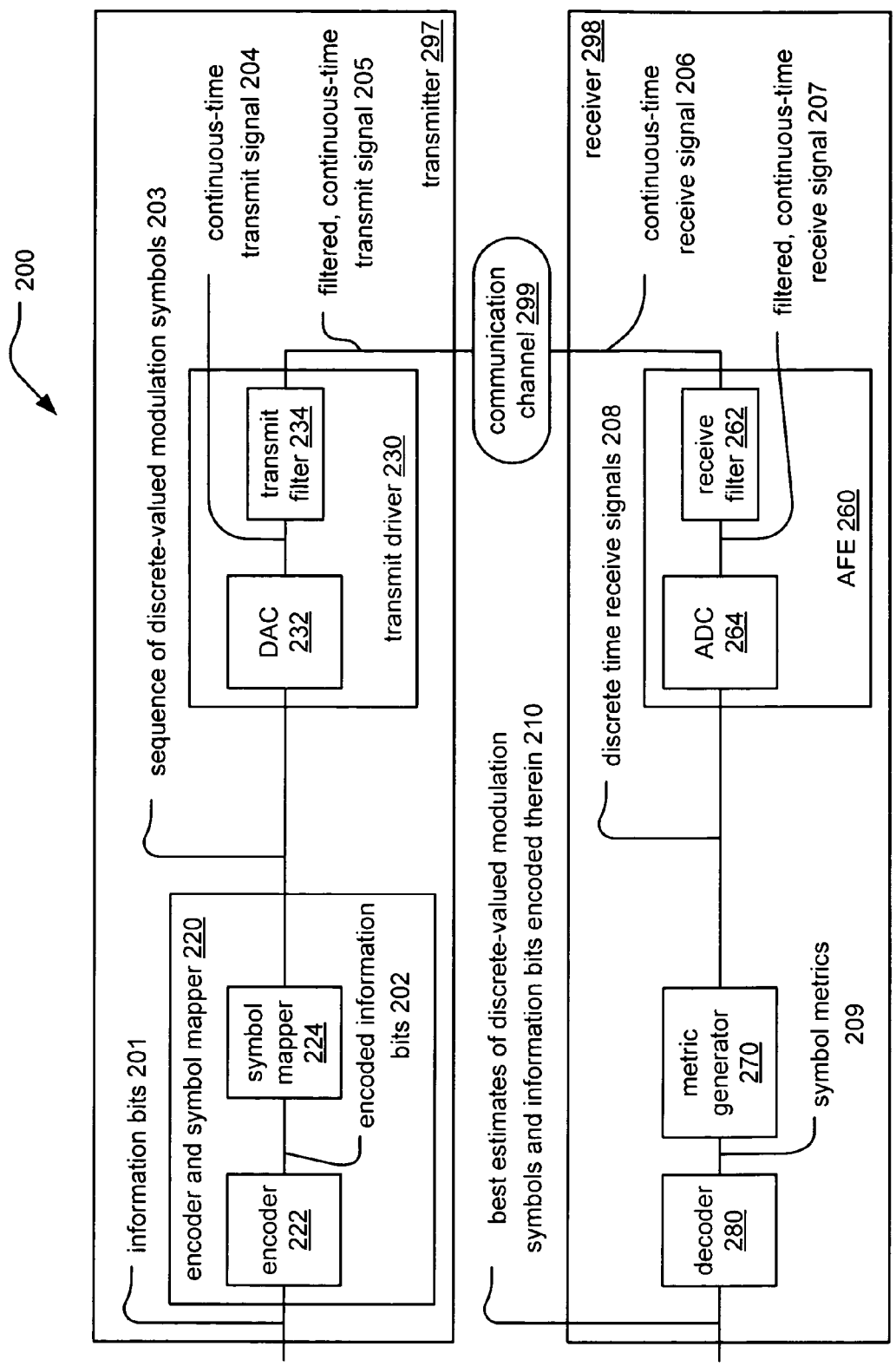

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
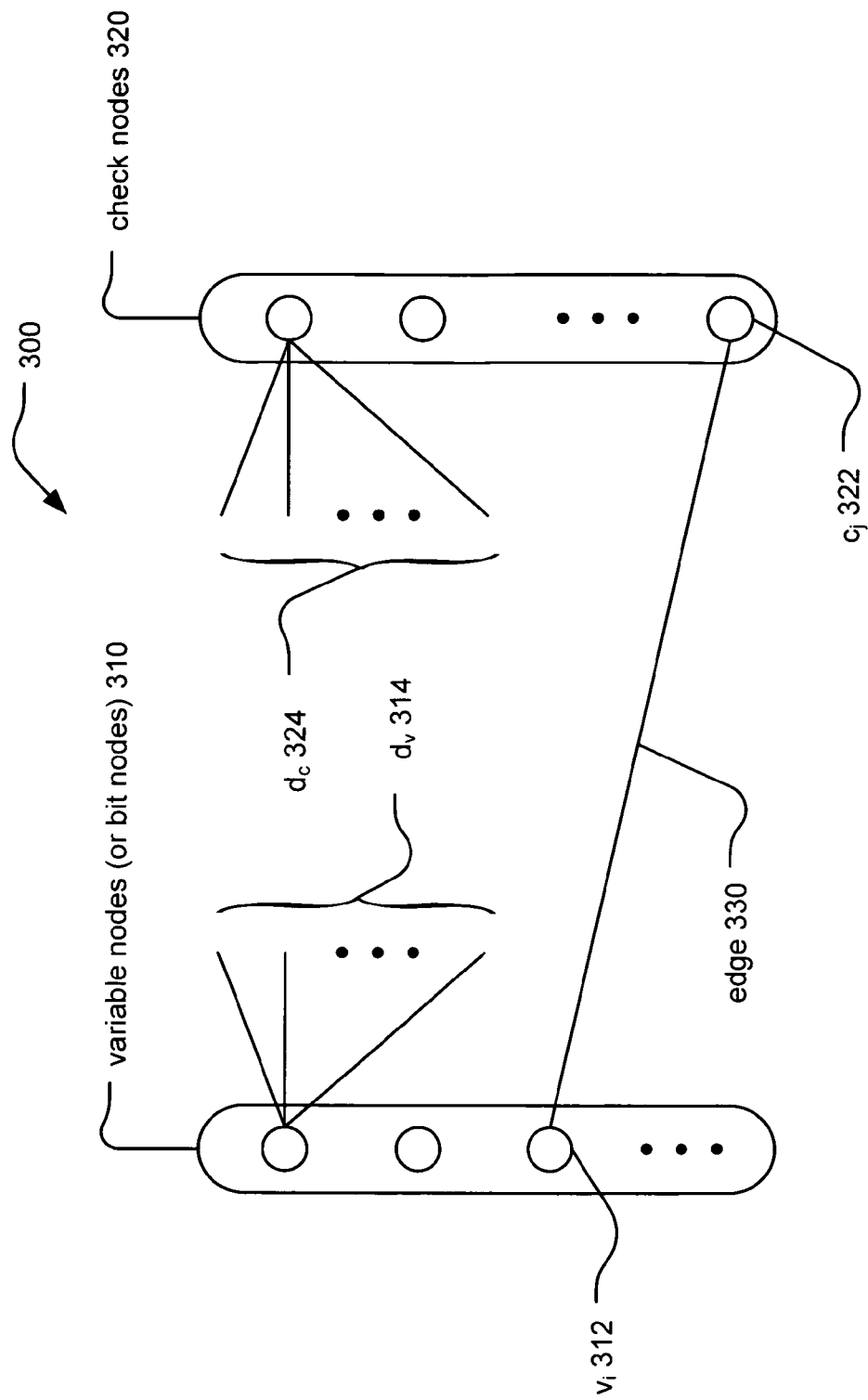
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e), c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC.

Figure 4:
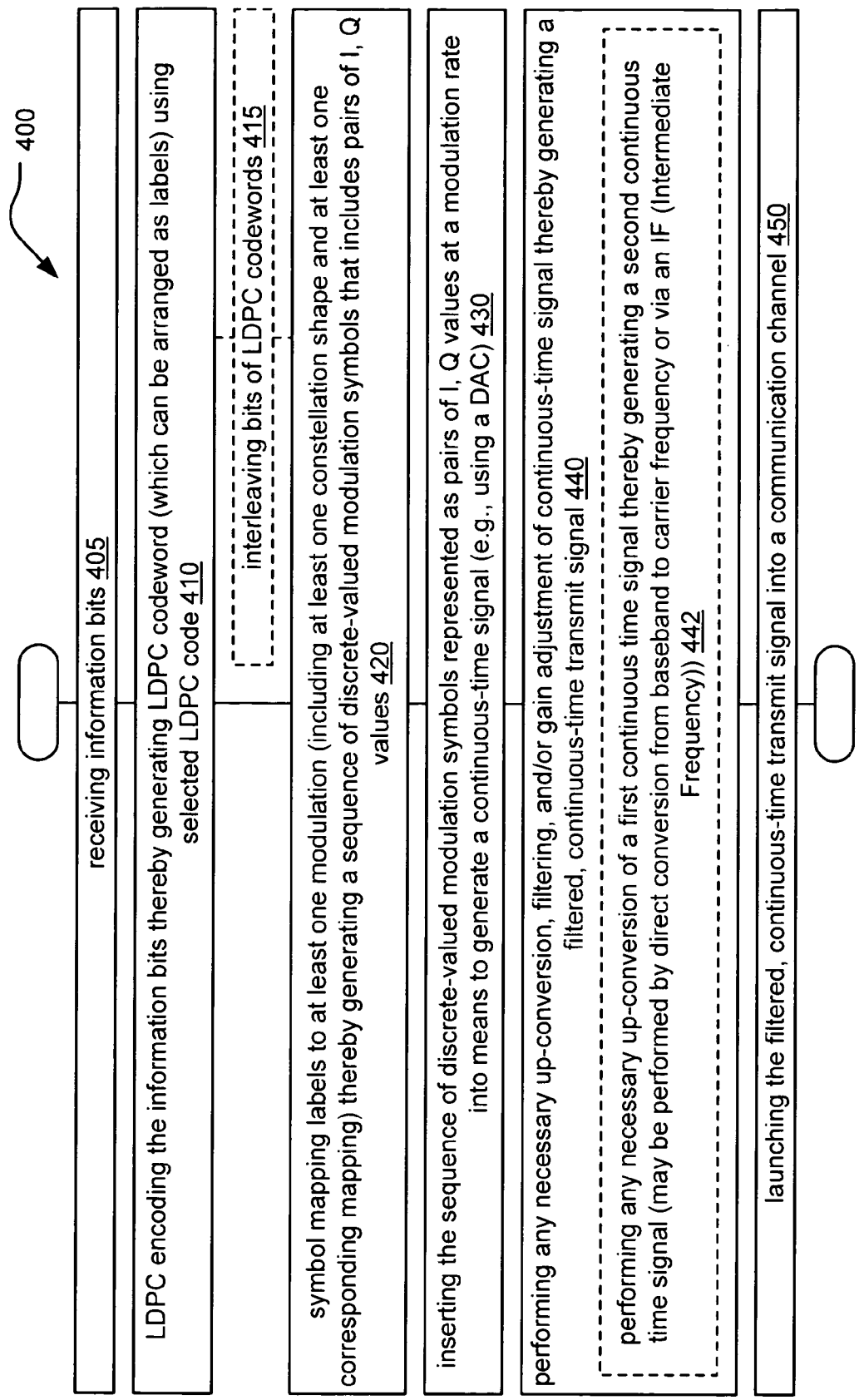
FIG. 4 illustrates an embodiment of a method for transmit processing of an LDPC coded signal.

FIG. 4 illustrates an embodiment of a method 400 for transmit processing of an LDPC coded signal. The method 400 that may be viewed as being performed at a transmitter end of a communication channel.

This method 400 also may be viewed as involving the generation of an LDPC coded signal as well as any operations to that are required to comport the LDPC coded signal to a communication channel into which a corresponding continuous-time transmit signal is to be launched.

Initially, this method 400 involves receiving information bits, as shown in a block 405. These information bits correspond to the actual information that is desired to be transmitted from one end of a communication channel to the other. At the other end, an effort to making best estimates of these original information bits is made. Continuing on, this method 400 involves LDPC encoding the information bits thereby generating an LDPC codeword (which can be arranged as labels), as shown in a block 410. For example, the LDPC codeword (or LDPC block) can be arranged to include labels that all have the same number of bits or labels of different bit sizes. This encoding may be performed using a selected LDPC code. In some instances, the method 400 may also involve interleaving the bits of a LDPC codeword after encoding them using an LDPC code, as shown in a block 415.

Then, as shown in a block 420, the method 400 then continues by symbol mapping the labels to at least one modulation (that includes at least one constellation shape and at least one corresponding mapping). In some embodiments, these labels are symbol mapped to a number of different modulation types thereby generating a variable modulation and/or code rate signal whose modulation and/or code rate may vary as frequently as on a frame by frame basis or even as frequently as on a symbol by symbol basis. This symbol mapping of the labels to at least one modulation thereby generates a sequence of discrete-valued modulation symbols that includes pairs of I, Q values (or higher dimensional constellation). At this point, the sequence of discrete-valued modulation symbols may be viewed as being an LDPC coded modulation signal (being in completely digital form at this point).

The method 400 then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method 400 may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method 500 that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). The diagram illustrated and described below shows the method 500 by which the receive processing of such a received continuous-time signal (e.g., at a receiver end of a communication channel) may be performed in an effort ultimately to make best estimates of the information bits that had been encoded therein.

Figure 5:
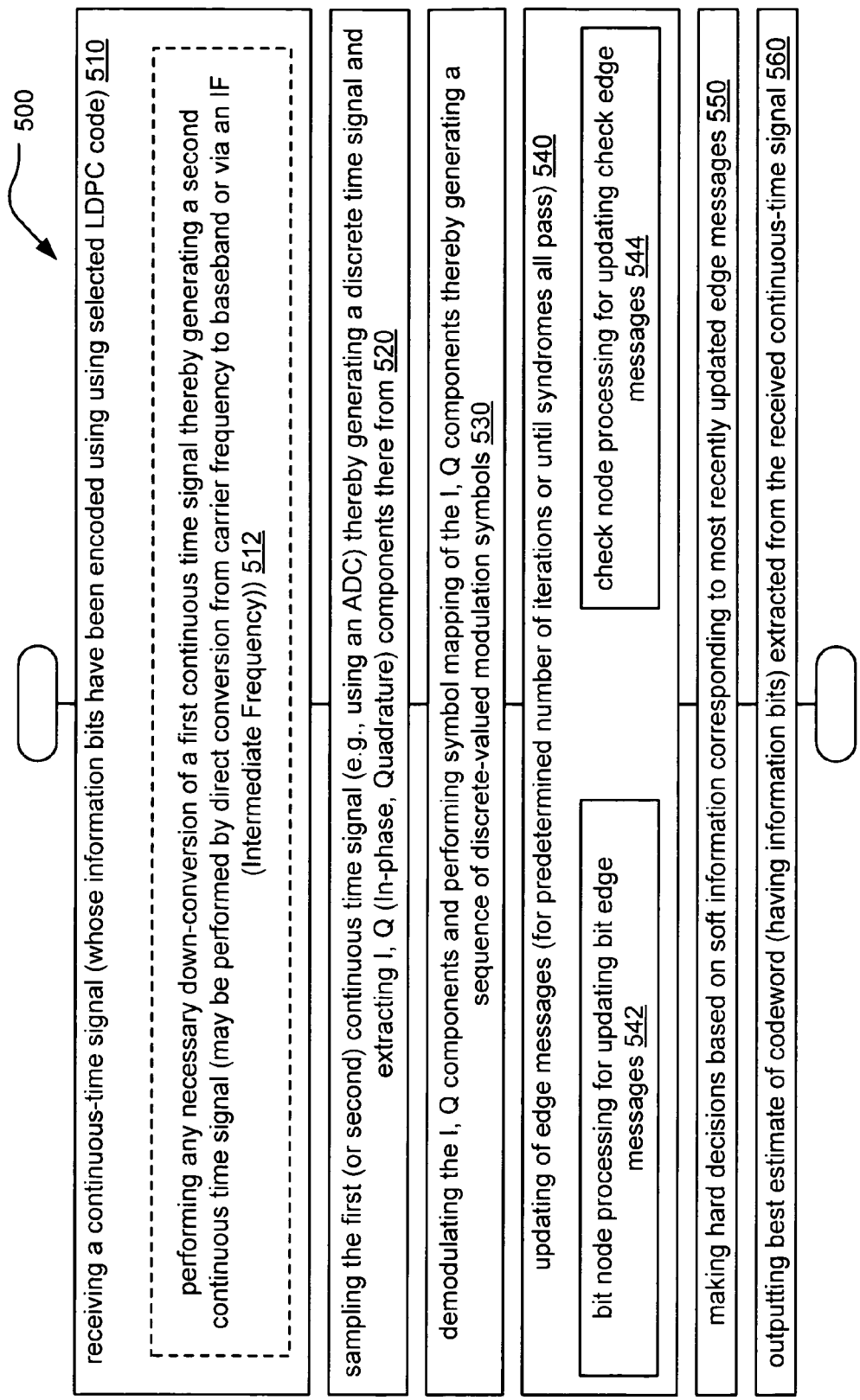
FIG. 5 illustrates an embodiment of a method for receive processing of an LDPC coded signal.

FIG. 5 illustrates an embodiment of a method 500 for receive processing of an LDPC coded signal. The method 500 initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method 500.

The method 500 also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method 500 then involves demodulating the I, Q components and performing symbol mapping of the I, Q components thereby generating a sequence of discrete-valued modulation symbols, as shown in a block 530.

The next step of the method 500 of this embodiment involves performing updating of edge messages for a predetermined number of iterations, as shown in a block 540. This step may be viewed as performing the LDPC decoding in accordance with any of the various embodiments described above. This LDPC decoding generally involves bit node processing for updating bit edge messages (as shown in a block 542) as well as check node processing for updating check edge messages (as shown in a block 544).

After the final decoding iteration of the predetermined number of decoding iterations (or until all syndromes of the LDPC code are equal to zero (i.e., all syndromes pass) in an alternative embodiment), the method 500 involves making hard decisions based on soft information corresponding to most recently updated edge messages with respect to the bit nodes, as shown in a block 550. The method 500 ultimately involves outputting a best estimate of the codeword (that includes the information bits) that has been extracted from the received continuous-time signal, as shown in a block 560.

Figure 6:
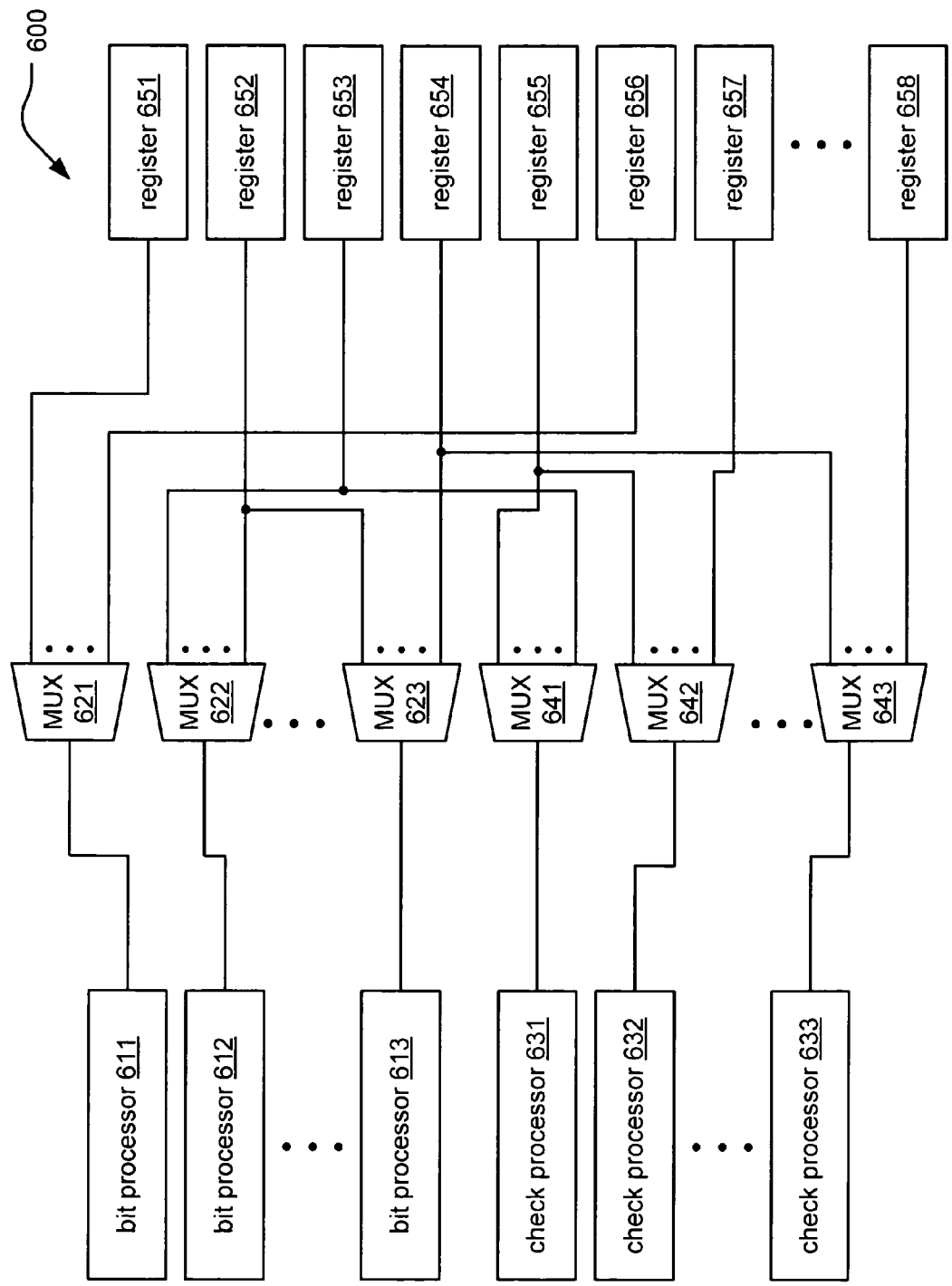
FIG. 6 illustrates an embodiment of a plurality of registers multiplexed among a plurality of bit processors and check processors.

FIG. 6 illustrates an embodiment 600 of a plurality of registers multiplexed among a plurality of bit processors and check processors. In previous designs which implement the decoding in a totally parallel setup, the number of bit nodes of the LDPC code (e.g., which can be extracted from the LDPC bipartite graph) determines the number of bit processors to be employed on a 1 to 1 basis. Similarly, in a totally parallel setup, the number of check nodes of the LDPC code (e.g., which can be extracted from the LDPC bipartite graph) determines the number of check processors to be employed on a 1 to 1 basis. The number of edges of the LDPC code (which are selectively connected between the bit nodes and the check nodes of the LDPC bipartite graph) determines the number of registers to be employed on the 1 to 1 basis. Each of the bit node processing and the check node processing is therefore performed in 1 cycle each. During bit node processing, each bit processor communicates with its corresponding group of registers. During check node processing, each check processor communicates with its corresponding group of registers.

In such a totally parallel setup, the totally number of bit processor and check processors can be very large. In some designs, this large consumption of space and processing resources in a device is undesirable and/or extremely expensive in terms of cost and/or real estate consumption.

In contradistinction, the embodiment 600 shows how a reduced number of both bit processors and check processors can be employed to reduce significantly the amount of real estate to be consumed with these processing resources. A plurality of multiplexors (MUXes) is employed selectively to communicatively couple each of a plurality of bit processors (or a subset thereof) or a plurality of check processors (or a subset thereof) to a plurality of registers that is employed to perform management of the edge messages (i.e., bit edge messages and check edge messages) that are updated and employed when performing iterative decoding of an LDPC coded signal.

With reference to FIG. 6, a plurality of bit processors is shown as bit processor 611, bit processor 612, . . . , and bit processor 613. Each bit processor is communicatively coupled to a MUX that allows the selective communicatively coupling to one or more of a plurality of registers (shown as register 651, register 652, register 653, register 654, register 655, register 656, register 657, . . . , register 659). Looking at some specific examples, the bit processor 611 communicatively couples to MUX 621 which allows for selective communicatively coupling to at least register 651 and 656, as well as any other registers as desired in the particular implementation.

The bit processor 612 communicatively couples to MUX 622 which allows for selective communicatively coupling to at least register 653 and 653, as well as any other registers as desired in the particular implementation. The bit processor 613 communicatively couples to MUX 623 which allows for selective communicatively coupling to at least register 652 and 654, as well as any other registers as desired in the particular implementation.

The check processor 631 communicatively couples to MUX 641 which allows for selective communicatively coupling to at least register 655 and 653, as well as any other registers as desired in the particular implementation. The check processor 632 communicatively couples to MUX 642 which allows for selective communicatively coupling to at least register 655 and 657, as well as any other registers as desired in the particular implementation. The check processor 633 communicatively couples to MUX 643 which allows for selective communicatively coupling to at least register 654 and 658, as well as any other registers as desired in the particular implementation.

Clearly, the number of each of bit processors, check processors, and MUXes can be selected as desired for a particular application. The number of registers employed is determined by the particular LDPC code being employed (e.g., as determined by its corresponding LDPC bipartite graph). When implementing a device capable to accommodate a number of different LDPC codes, the one LDPC requiring the largest number of registers will govern the total number of registers to be employed. When selecting the numbers and arrangement of such resources, a designer is provided the ability to make trade offs within a design. For example, when a fewer number of processors is employed (for each of bit processors and check processors), then a larger number of cycles needs to be performed when performing either bit node processing or check node processing. The fewer number of processors employed will reduce the amount of real estate consumed within the device and can provide for a lower cost, but the processing time will take longer by requiring more cycles for each of bit node processing and check node processing. Also, the memory management and connectivity required to connect bit processors, check processors, MUXes, and registers within an actual device should be considered, as this also consumes a certain degree of real estate and incurs a certain complexity and cost.

However, this design approach can be customized to a given application relatively easily by a designer. A designer can find the "sweet spot" in terms of selecting the appropriate amount of each of these resources (bit processors, check processors, and MUXes) to meet his design objectives. For some designs, a reduced processing time is paramount and could lead to a semi-parallel design approach for each of the bit node processing and check node processing. Alternatively, in other designs, a reduced real estate (and/or reduced cost) is paramount, and a relatively fewer number of each of the bit processors and check processors is desirable.

Figure 7:
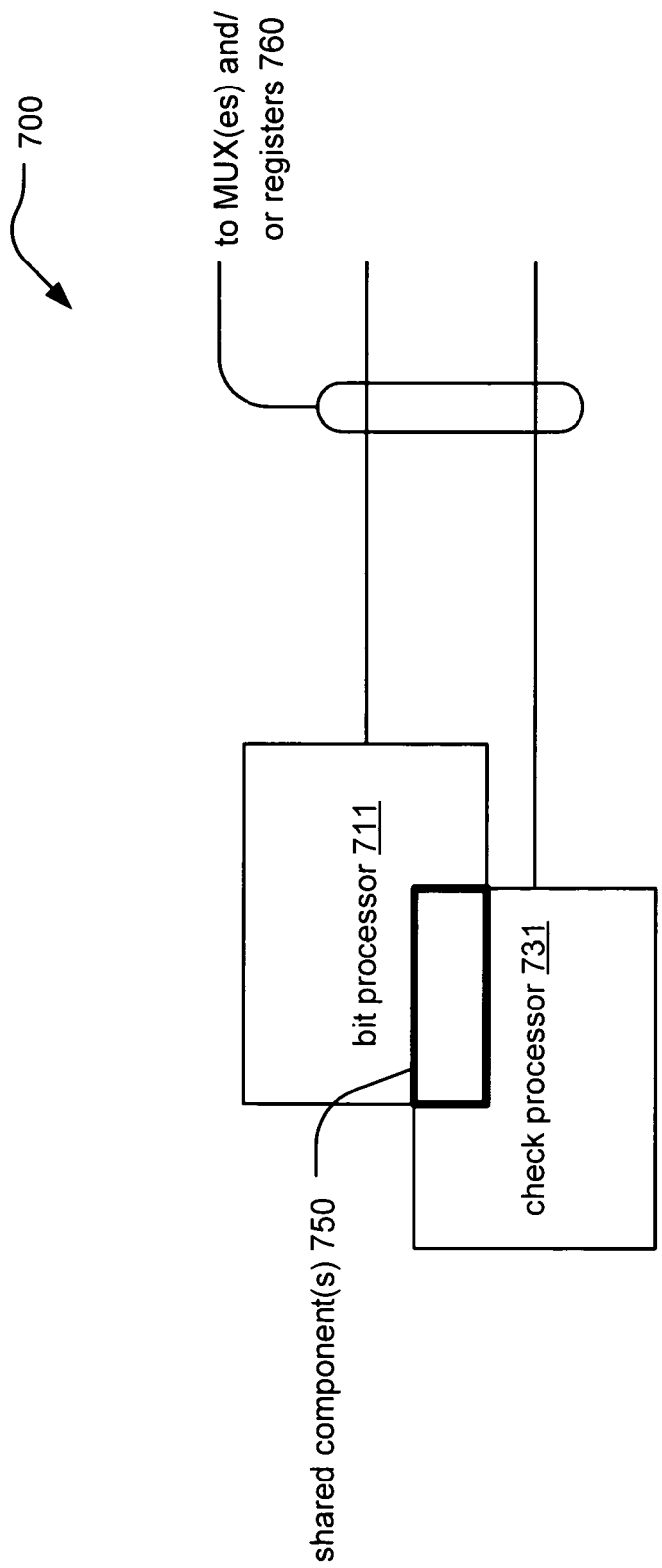
FIG. 7 illustrates an embodiment of a bit processor and a check processor such that at least one common component is employed by each.

FIG. 7 illustrates an embodiment 700 of a bit processor 711 and a check processor 731 such that at least one common component (shown by shared component(s) 750) is employed by each. Each of the bit processor 711 and a check processor 731 communicatively couples to a MUX and/or registers as shown by the lines 760.

This diagram shows how certain components may be shared and used when performing both bit node processing and check node processing by a bit processor 711 and a check processor 731, respectively. This efficiency in terms of reusing certain components can result in a reduction in complexity and a reduction in size (thanks to the re-use of components).

In some instances, each of the bit node processing and check node processing performs at least one similar calculation, and the functionality employed to perform this calculation can then be employed by each of the bit processor 711 and the check processor 731. For example, the shared component(s) 750 can be as simple as a single shared adder, subtractor, and/or other mathematical calculation functional block that is employed by each of the bit processor 711 and the check processor 731, respectively, when performing bit node processing and check node processing.

These examples show just some possible means by which certain components may be shared and used when performing both bit node processing and check node processing within the bit processor 711 and the check processor 731 that are implemented to perform bit node processing and check node processing. Clearly, other optimizations of shared components may also be performed to conserve device size and reduce complexity without departing from the scope and spirit of the invention.

Figure 8:
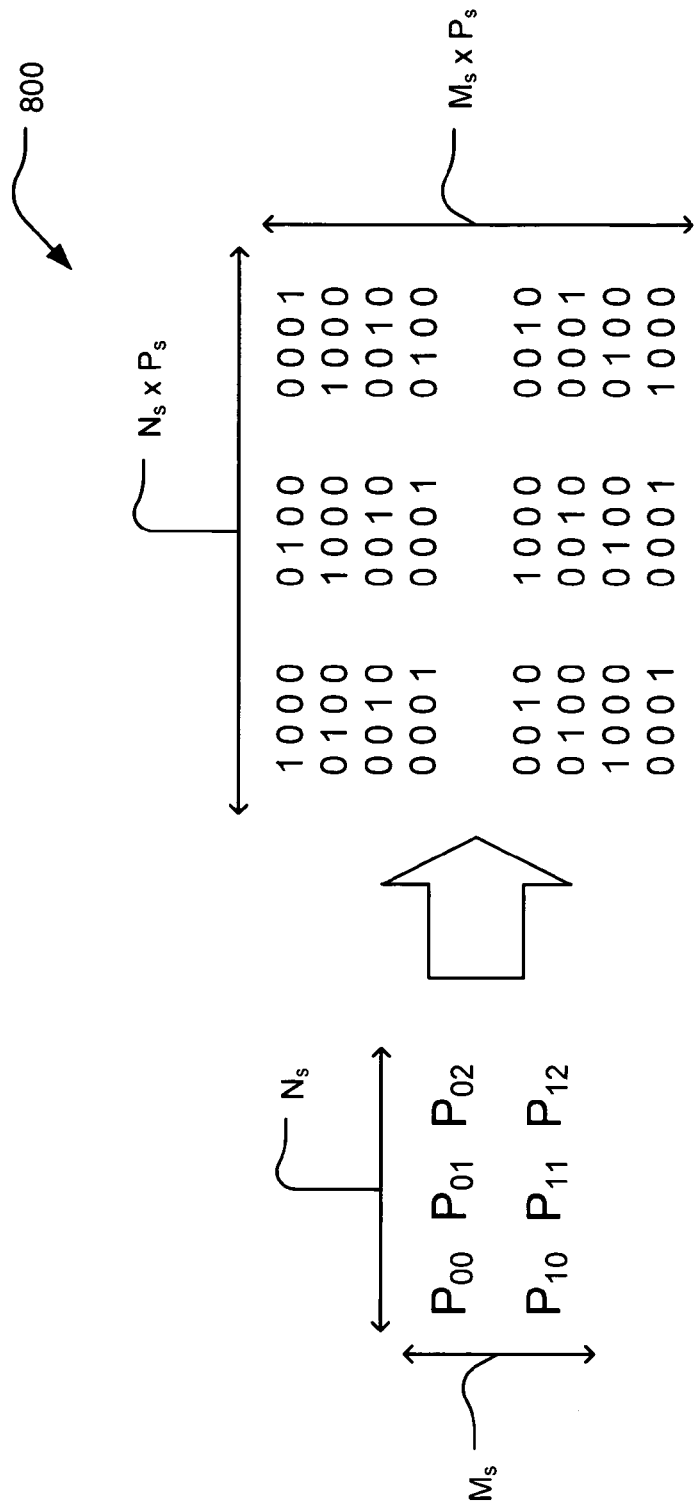
FIG. 8 illustrates an embodiment of a low density parity check matrix, H.

FIG. 8 illustrates an embodiment 800 of a low density parity check matrix, H. Several embodiments are depicted below with reference to the general structure of this low density parity check matrix, H. A low density parity check matrix, H, can be extracted from an LDPC bipartite graph (e.g., the one depicted in FIG. 3). It is noted that the low density parity check matrix, H, can correspond to a regular LDPC code or an irregular LDPC code in various embodiments.

It is noted, in the case of processing irregular LDPC codes, that the number of edges being processed per cycle may not always be the same. For example, one way to transform a regular LDPC code to an irregular LDPC code is to puncture or eliminate some of the non-zero entries therein. In such a case, a regular LDPC code can be considered in which n edges are processed each cycle in a semi-parallel approach (embodiments of which are described in more detail below). For example, two cycles are performed when processing a regular LDPC code, and n edges are processed in each cycle. If the low density parity check matrix corresponding to this regular LDPC code is modified by puncturing one of the "1"s (e.g., non-zero elements) in the upper left hand corner, for example, then only n−1 edges would be processed in the first cycle, and n edges would be processed in the second cycle. Depending on the number of pluralities of bit edge messages and check edge messages into which the total number of bit edge messages and check edge messages are partitioned, respectively, the number of edges being processed in each cycle may be slightly different when processing irregular LDPC codes. The same analysis provided above with respect to the semi-parallel approach can also be applied to even more parallel approaches without departing from the scope and spirit of the invention when dealing with irregular LDPC codes, in that, different numbers of edges may be processed during different cycles.

Looking at the left hand side of this diagram, it can be seen that the low density parity check matrix, H, is composed of a plurality of permutation matrices, depicted by $P_{00}$, $P_{01}$, $P_{02}$, $P_{10}$, $P_{11}$, and $P_{12}$. The number of columns of permutation matrices of the low density parity check matrix, H, is shown as being $N_s$, and number of rows of permutation matrices of the low density parity check matrix, H, is shown as being $M_s$. $P_s$ is the order the permutation matrix that is used to generate the sub-matrices of the low density parity check matrix, H. $N=N_s \times P_s$ is the number of bits of the LDPC code, and $M=M_s \times P_s$ is the number of rules (or check) that these bits have to satisfy for proper error correction decoding. The total number of edges of the LDPC bipartite graph, that selectively connect the bit nodes to the check nodes, is $N_s \times M_s \times P_s$.

Looking at the right hand side of this diagram, it can be seen that the number of columns of the low density parity check matrix, H, is shown as being $N_s \times P_s$. The number of rows of the low density parity check matrix, H, is shown as being $M_s \times P_s$.

Clearly, other forms of his low density parity check matrices, H, can be employed as well without departing from the scope and spirit of the invention. This particular low density parity check matrix, H, is employed for illustration with reference to some possible embodiments described below. For another low density parity check matrix, H, other appropriate partial parallel designs can also be achieved using a similar design approach as the one presented here.

Figure 9:
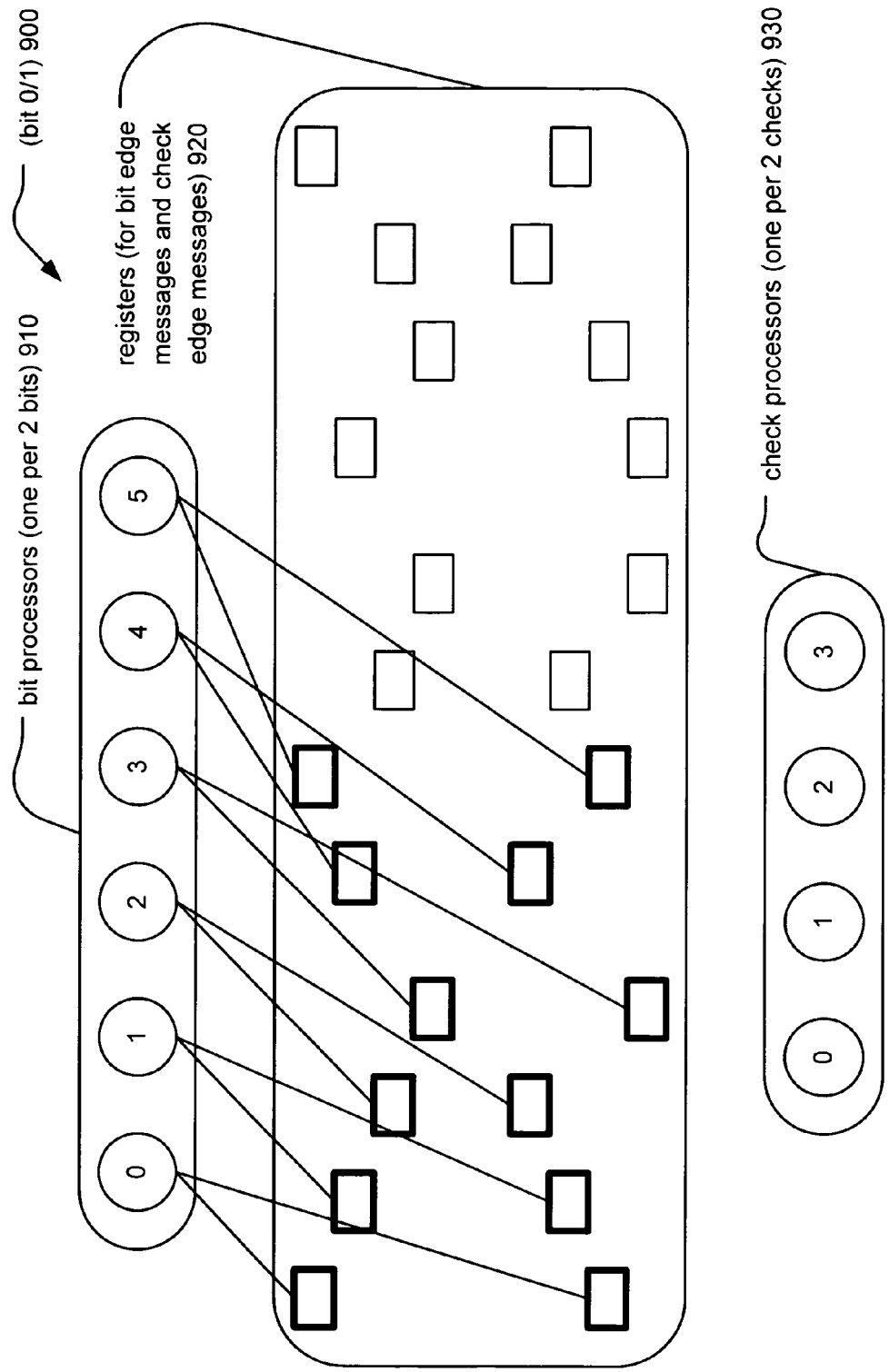
FIG. 9 and FIG. 10 illustrate embodiments of bit node processing (0/1) and (1/1), respectively.
Figure 10:
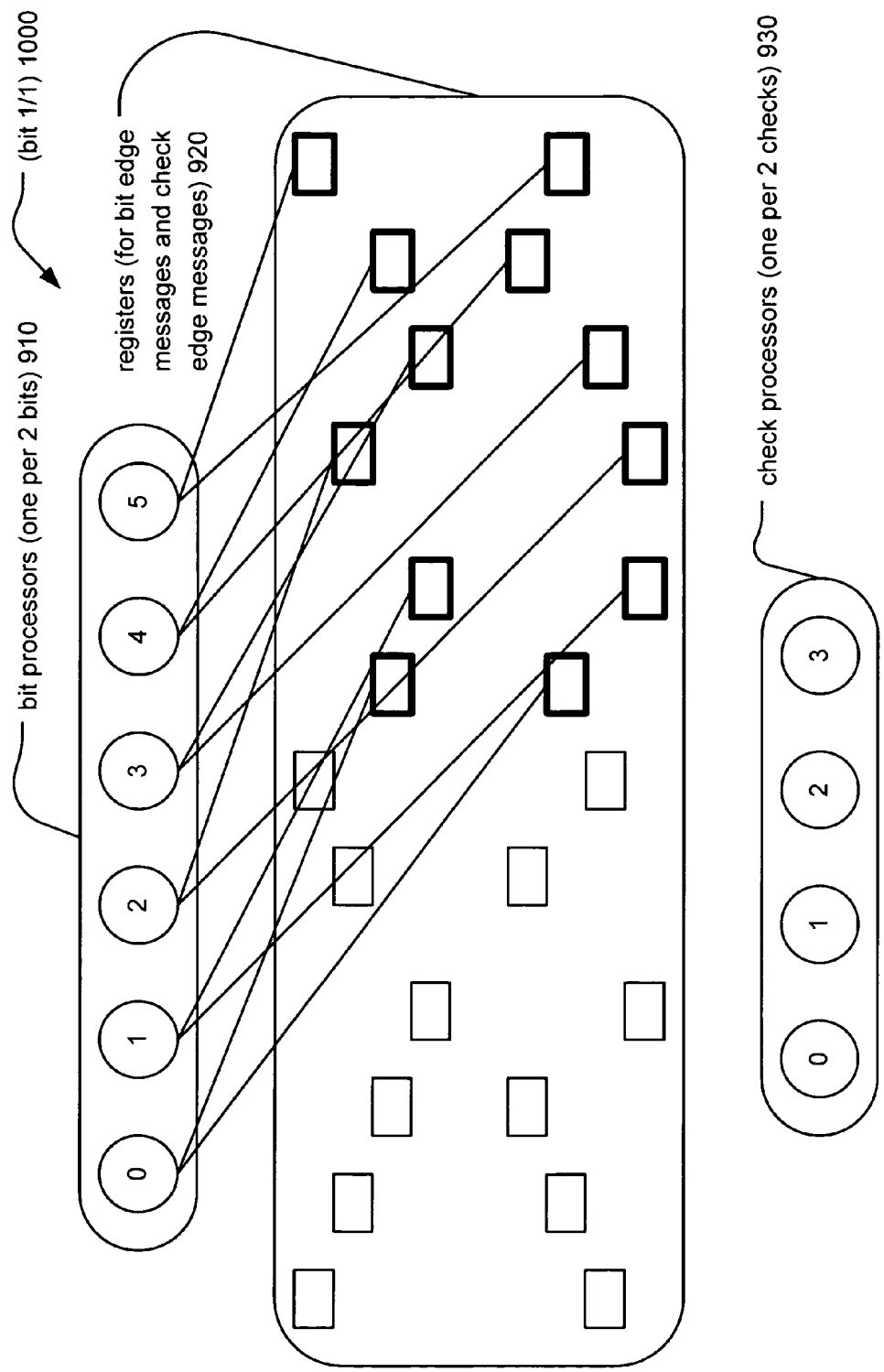

FIG. 9 and FIG. 10 illustrate embodiments 900 and 1000 of bit node processing (0/1) and (1/1), respectively. In total, 2 cycles are required to perform this partial parallel approach to bit node processing. This approach can be characterized as a semi-parallel approach, in that, there are 2 cycles that are performed during each bit node processing step. In these embodiments, one bit processor is employed per 2 bits.

Generally speaking, the embodiments 900 and 1000 employ a total number of bit processors 910 that is ½ the total number of bit nodes of the LDPC code. Also, the embodiments 900 and 1000 employ a total number of check processors 930 that is ½ the total number of check nodes of the LDPC code. The total number of bit nodes and the total number of check nodes can be deduced from the LDPC bipartite graph representative of the LDPC code. This graph also depicted the selective connectivity of the edges between certain of the bit nodes and the check nodes.

For example, in an embodiment that includes 12 bit nodes, then 6 or fewer bit processors can be employed in such a partial parallel embodiment (i.e., 6 would be employed a semi-parallel embodiment). A plurality of registers 920 is employed store the edge messages (i.e., bit edge messages updated during bit node processing, and the check edge messages updated during check node processing).

As mentioned above, in this embodiment, 2 cycles are performed during each bit node processing step, and each bit processor communicates with Ms registers. Each bit processor is selectively capable to be communicatively coupled to $2 \times M_s$ registers, this selective communicatively coupling can be achieved using MUXes as described above with reference to another embodiment. If the MUX approach is desired, then the total number of 2 to 1 MUXes required is $(P_s \times M_s \times N_s/2)$. The total number of edges that is processed per cycle is also $(M_s \times N_s \times P_s/2)$.

During the cycle 0/1 of the bit node processing (FIG. 9), the bit processors 910 are communicatively coupled to the registers located on the left hand side that correspond to the non-zero element locations of the left hand side of the low density parity check matrix, H, of the FIG. 8.

During the cycle 1/1 of the bit node processing (FIG. 10), the bit processors 910 are communicatively coupled to the registers located on the right hand side that correspond to the non-zero element locations of the right hand side of the low density parity check matrix, H, of the FIG. 8. As can be seen, one half of the bit node processing is actually being performed during each cycle.

Figure 11:
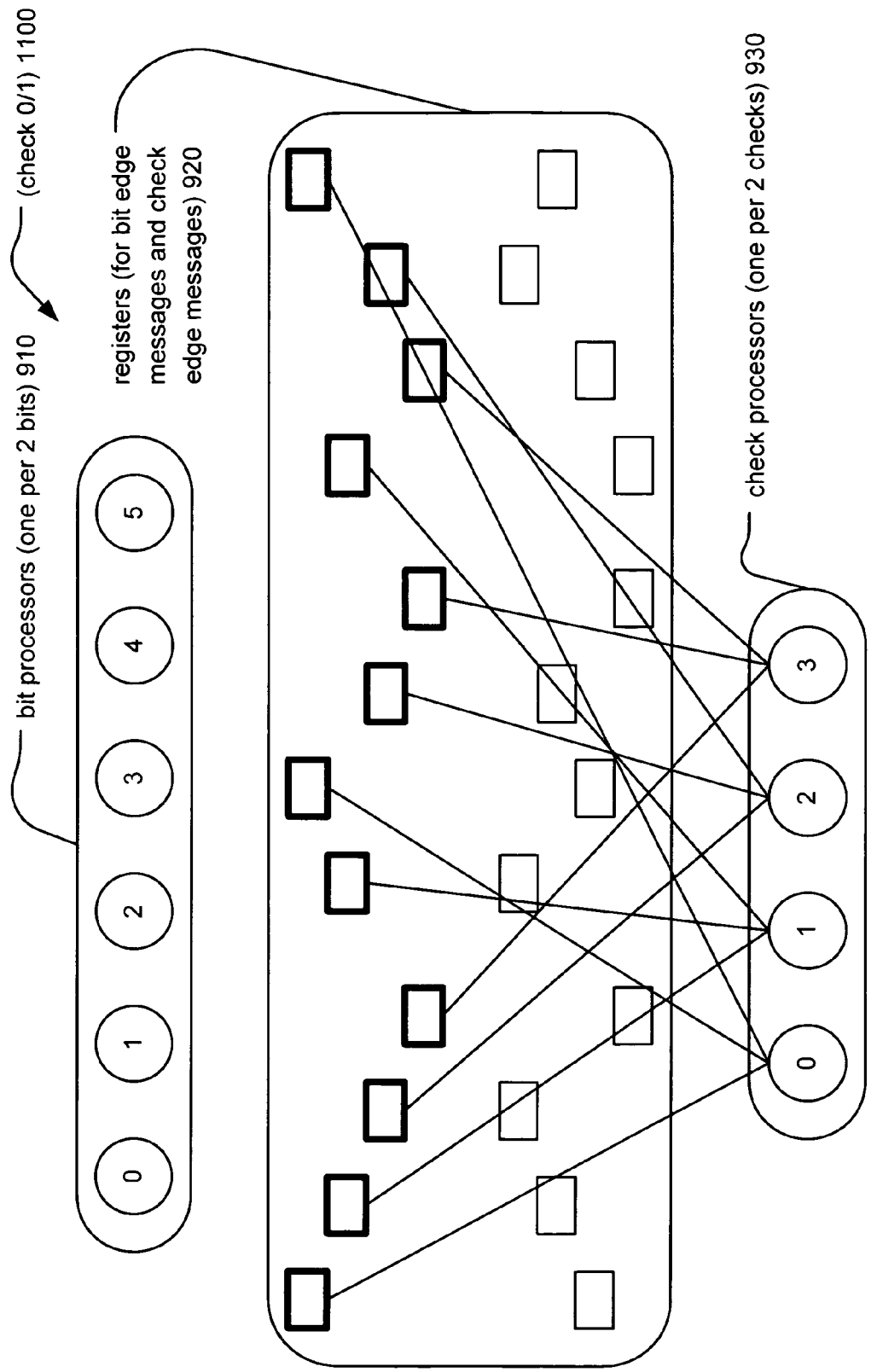
FIG. 11 and FIG. 12 illustrate embodiments of check node processing (0/1) and (1/1), respectively.
Figure 12:
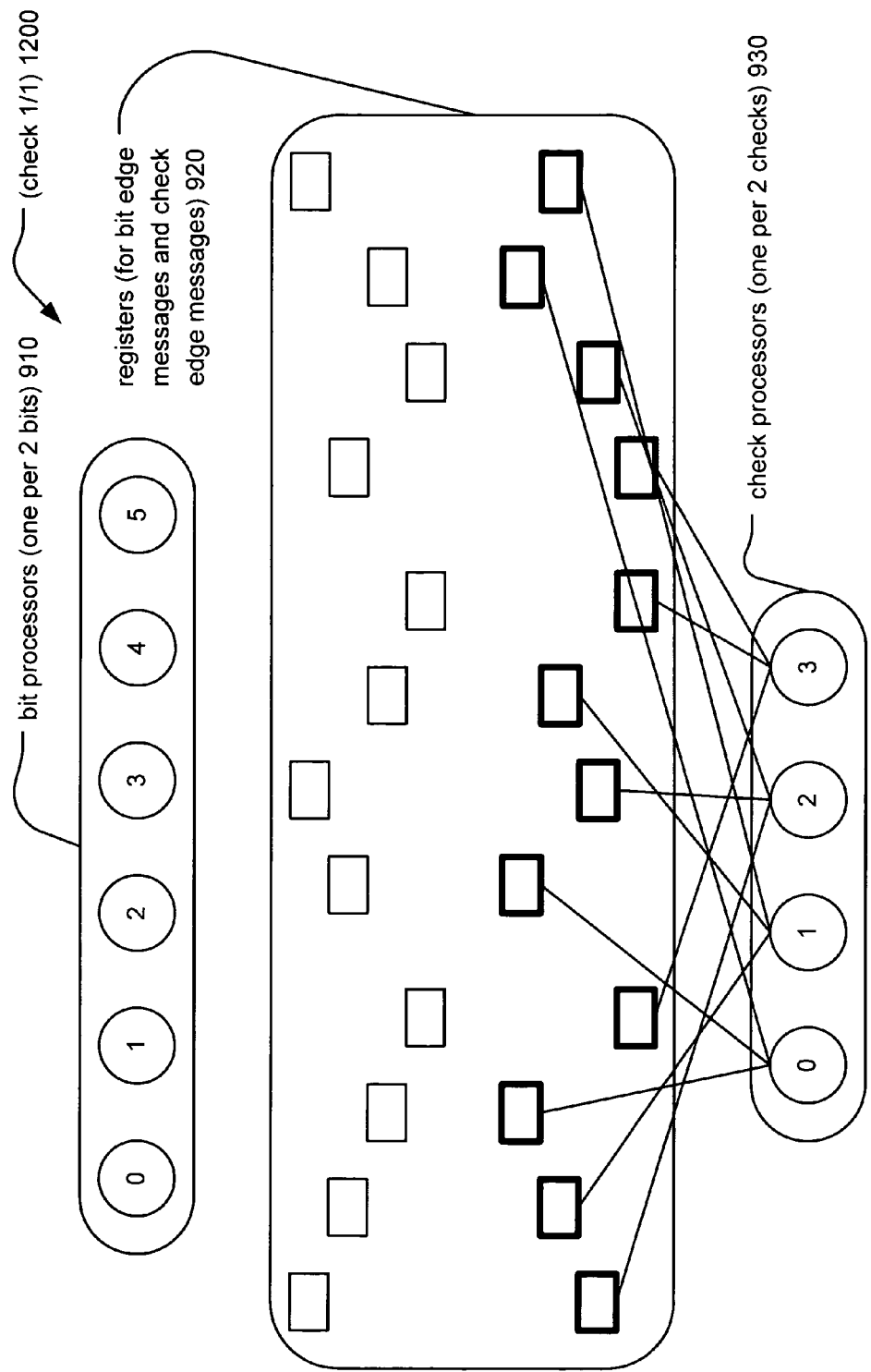

FIG. 11 and FIG. 12 illustrate embodiments 1100 and 1200 of check node processing (0/1) and (1/1), respectively. In total, 2 cycles are required to perform this partial parallel approach to check node processing. As similarly mentioned above, this approach can be characterized as a semi-parallel approach, in that, there are 2 cycles that are performed during each check node processing step. In these embodiments, one check processor is employed per 2 checks.

Generally speaking, the embodiments 1100 and 1200 employ a total number of check processors 930 that is ½ the total number of check nodes of the LDPC code. Also, the embodiments 1100 and 1200 employ a total number of check processors 930 that is ½ the total number of check nodes of the LDPC code. As mentioned above, the total number of bit nodes and the total number of check nodes can be deduced from the LDPC bipartite graph representative of the LDPC code. This graph also depicted the selective connectivity of the edges between certain of the bit nodes and the check nodes.

For example, in an embodiment that includes 8 check nodes, then 4 or fewer check processors can be employed in such a partial parallel embodiment (i.e., 4 would be employed a semi-parallel embodiment). A plurality of registers 920 is employed store the edge messages (i.e., bit edge messages updated during bit node processing, and the check edge messages updated during check node processing).

As mentioned above, in this embodiment, 2 cycles are performed during each check node processing step, and each check processor communicates with $N_s$ registers. Each check processor is selectively capable to be communicatively coupled to $2 \times N_s$ registers, this selective communicatively coupling can be achieved using MUXes as described above with reference to another embodiment. If the MUX approach is desired, then the total number of 2 to 1 MUXes required is $(P_s \times N_s \times M_s/2)$. The total number of edges that is processed per cycle is also $(M_s \times N_s \times P_s/2)$.

During the cycle 0/1 of the check node processing (FIG. 11), the check processors 930 are communicatively coupled to the registers located on the top half that correspond to the non-zero element locations of the top half of the low density parity check matrix, H, of the FIG. 8.

During the cycle 1/1 of the check node processing (FIG. 12), the check processors 930 are communicatively coupled to the registers located on the bottom half that correspond to the non-zero element locations of the bottom half of the low density parity check matrix, H, of the FIG. 8. As can be seen, one half of the check node processing is actually being performed during each cycle.

While the FIG. 9 and FIG. 10 (bit node processing) and FIG. 10 and FIG. 11 (check node processing) each depict semi-parallel processing approaches where one half of the bit node processing is performed during each of 2 cycles employed within bit node processing and one half of the check node processing is performed during each of 2 cycles employed within check node processing, it is noted that the number of cycles employed within each of the bit node processing and the check node processing can be selected to be different in different embodiments. Moreover, the number of cycles employed within the bit node processing need not be the same number of cycles employed within check node processing.

Figure 13:
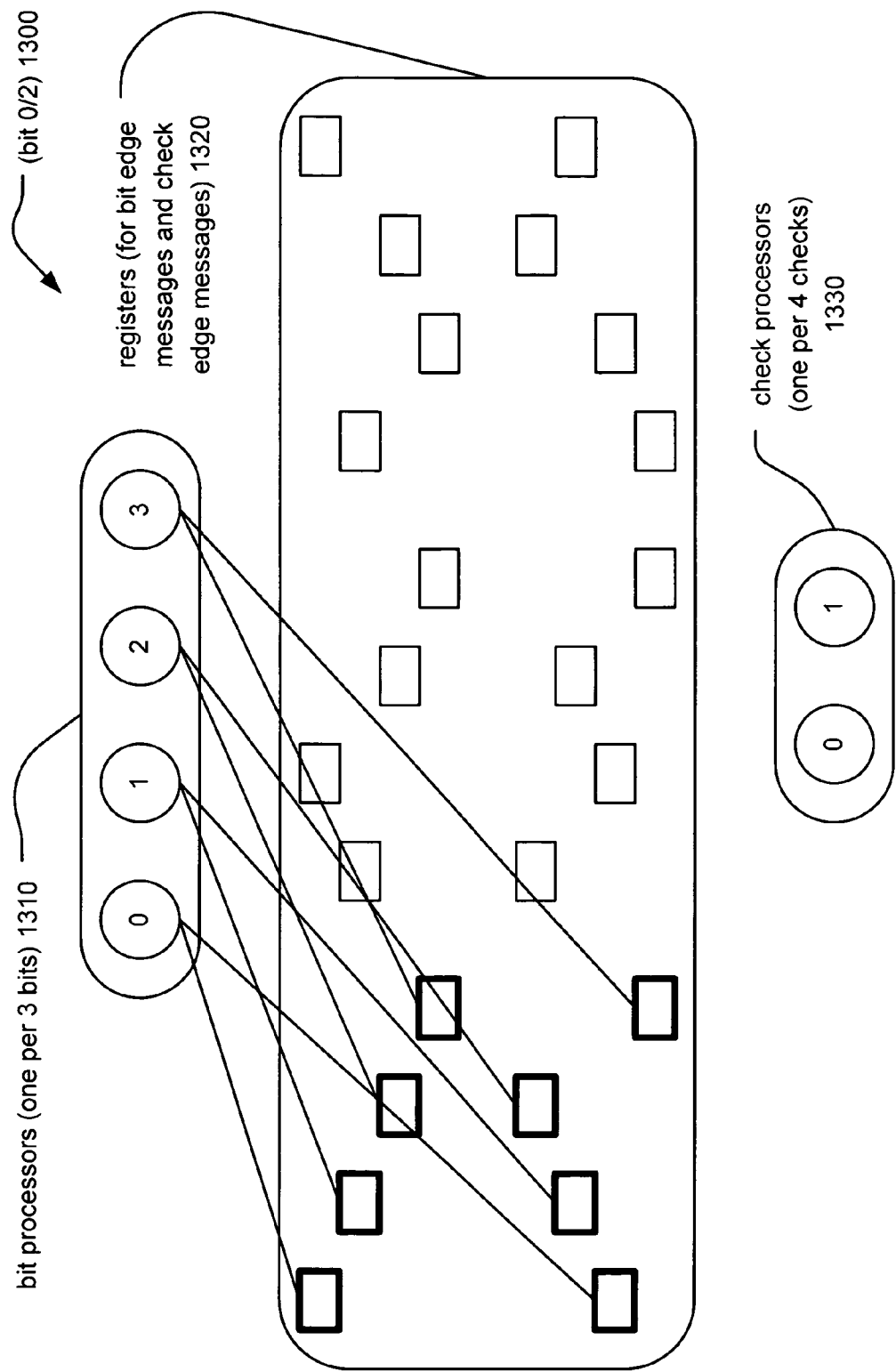
FIG. 13, FIG. 14, and FIG. 15 illustrate embodiments of bit node processing (0/2), (1/2) and (2/2), respectively.
Figure 14:
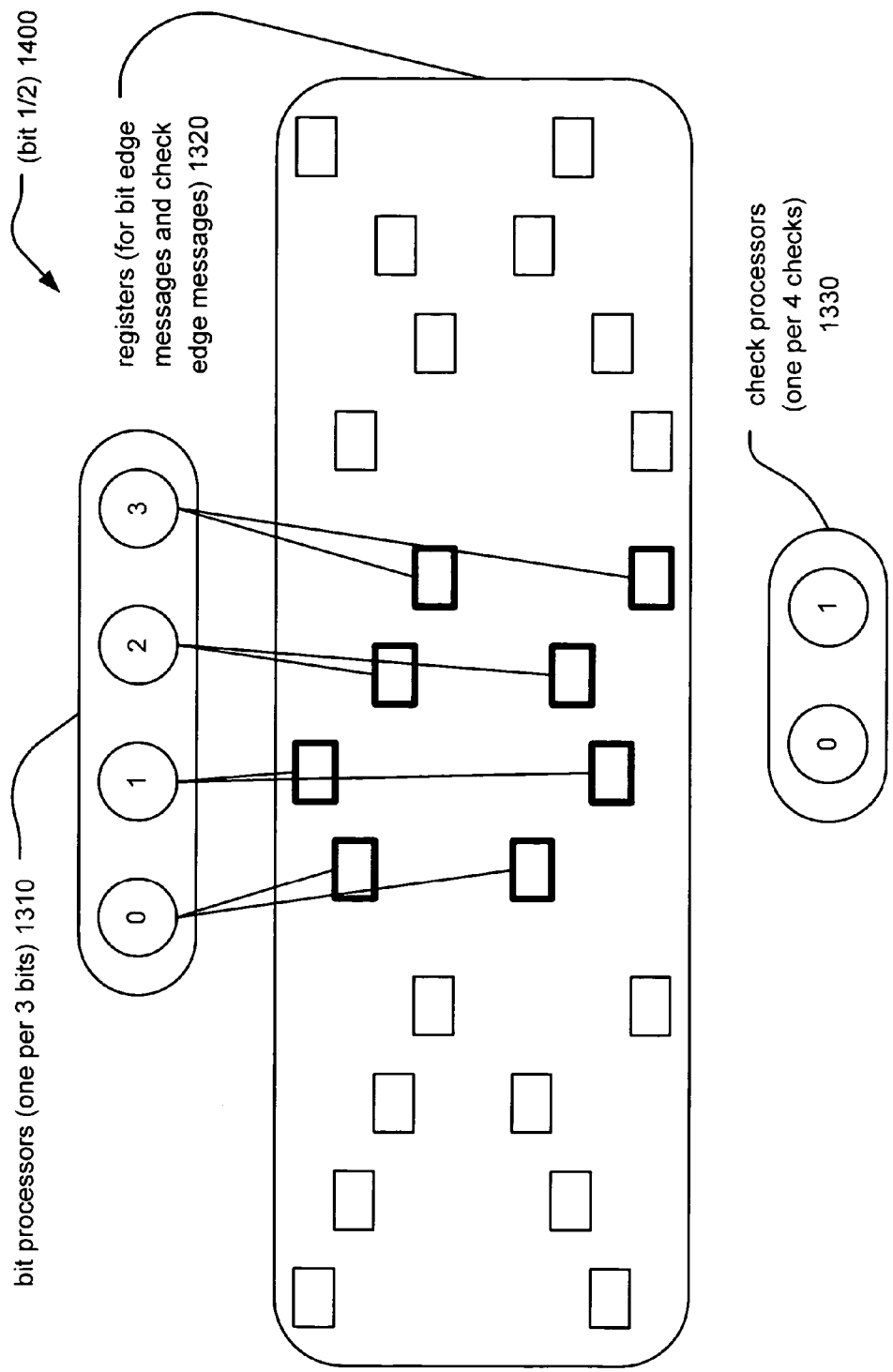
Figure 15:
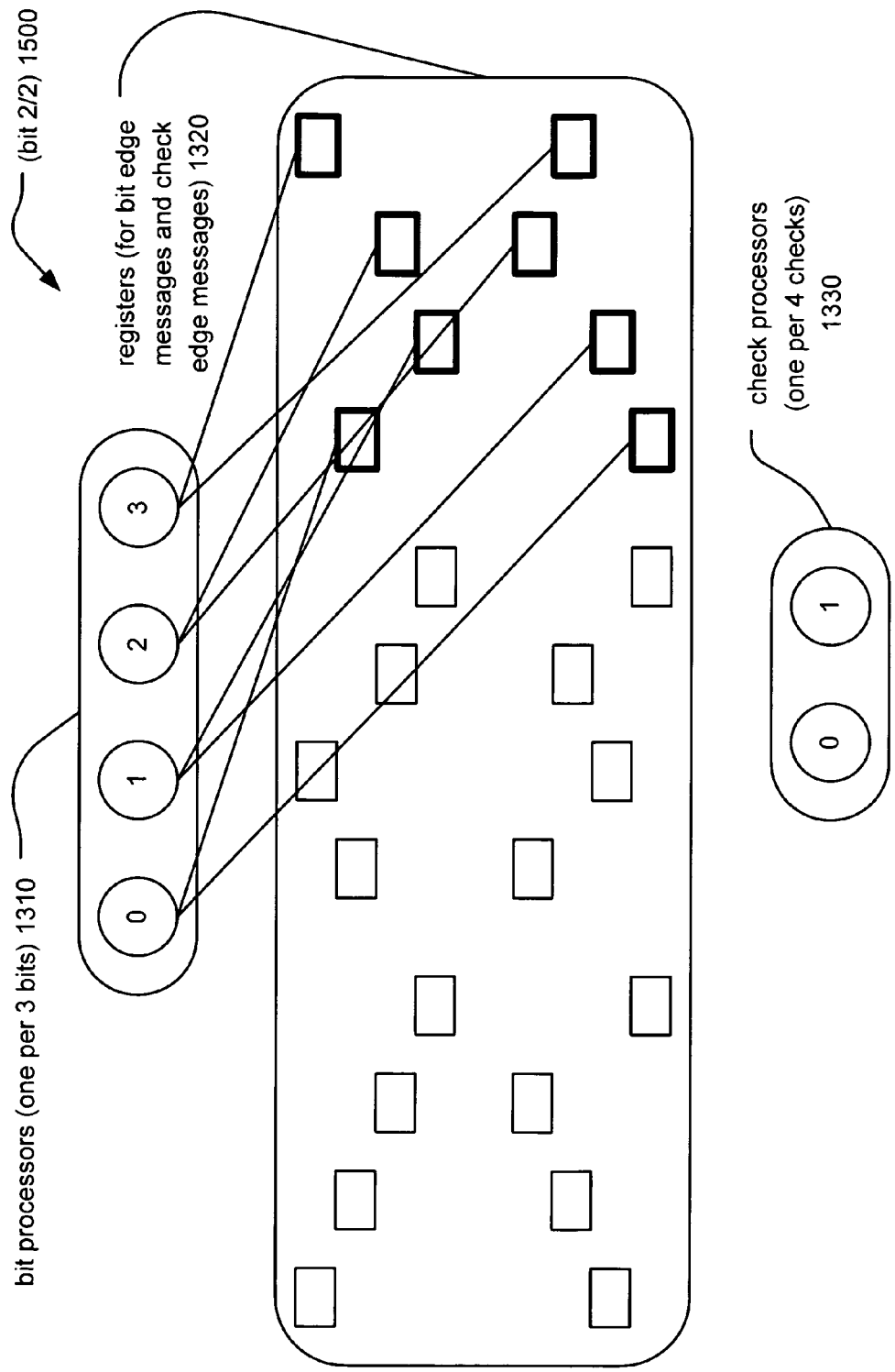
Figure 16:
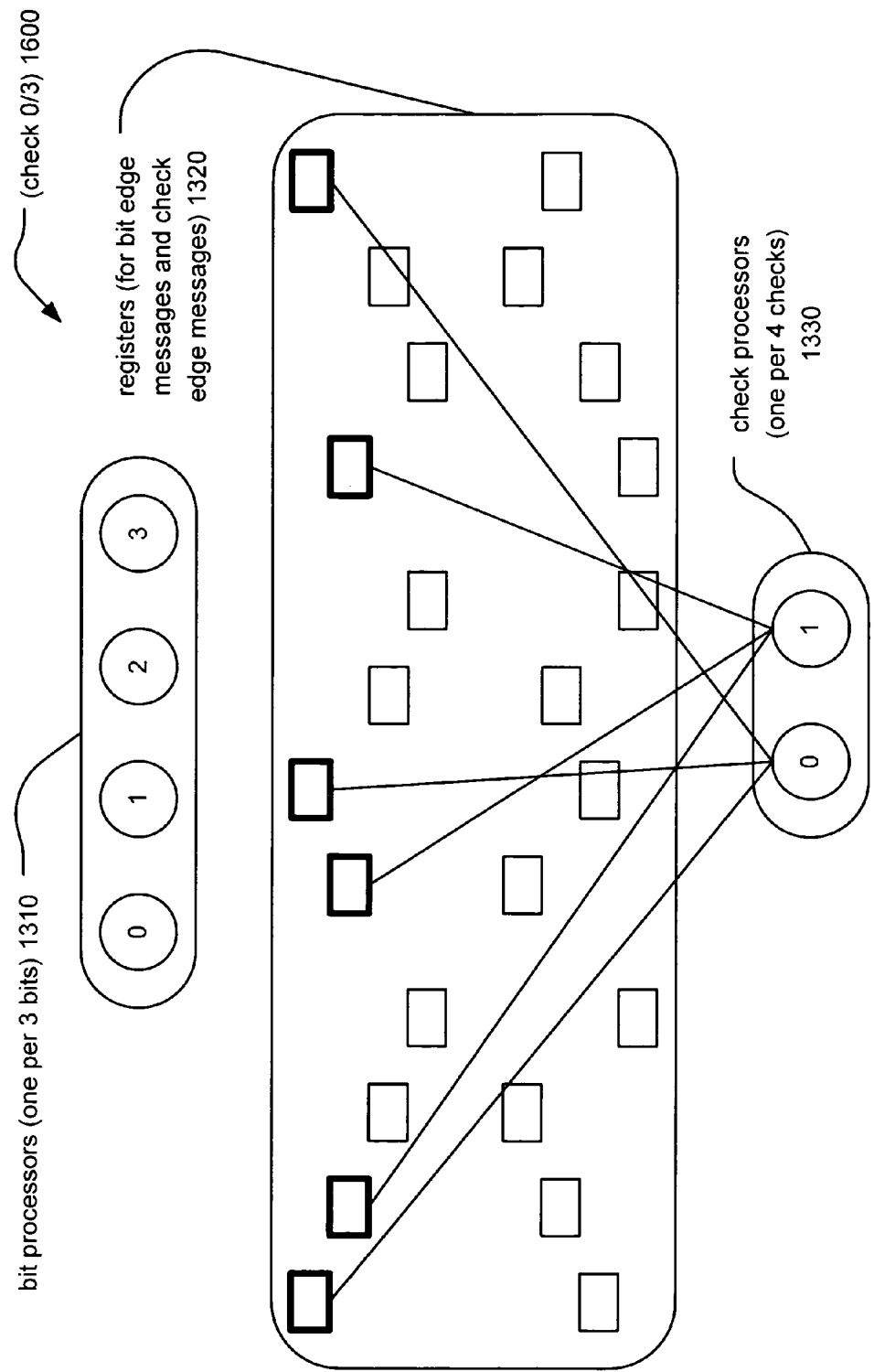
FIG. 16, FIG. 17, FIG. 18, and FIG. 19 illustrate embodiments of check node processing (0/3), (1/3), (2/3) and (3/3), respectively.
Figure 17:
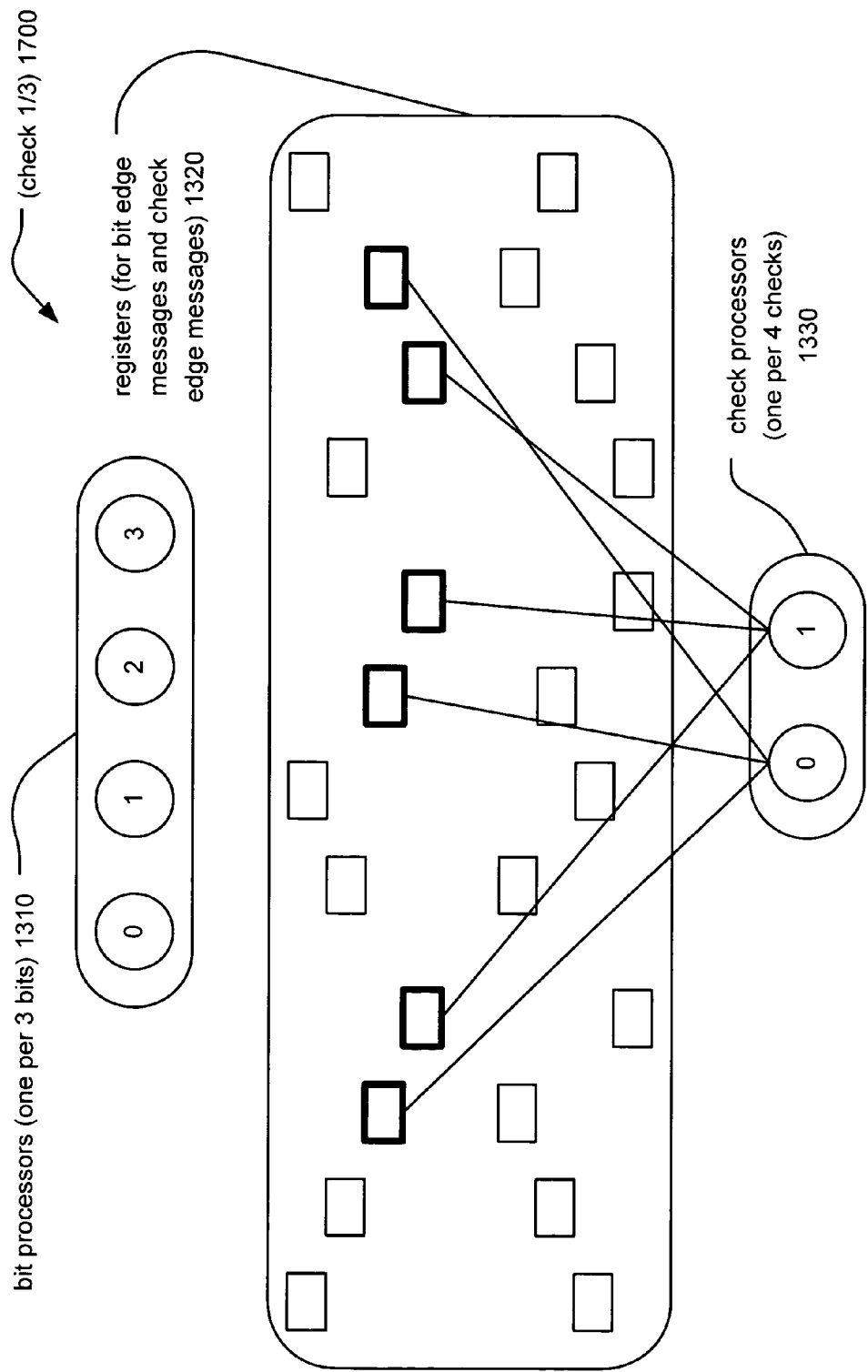
Figure 18:
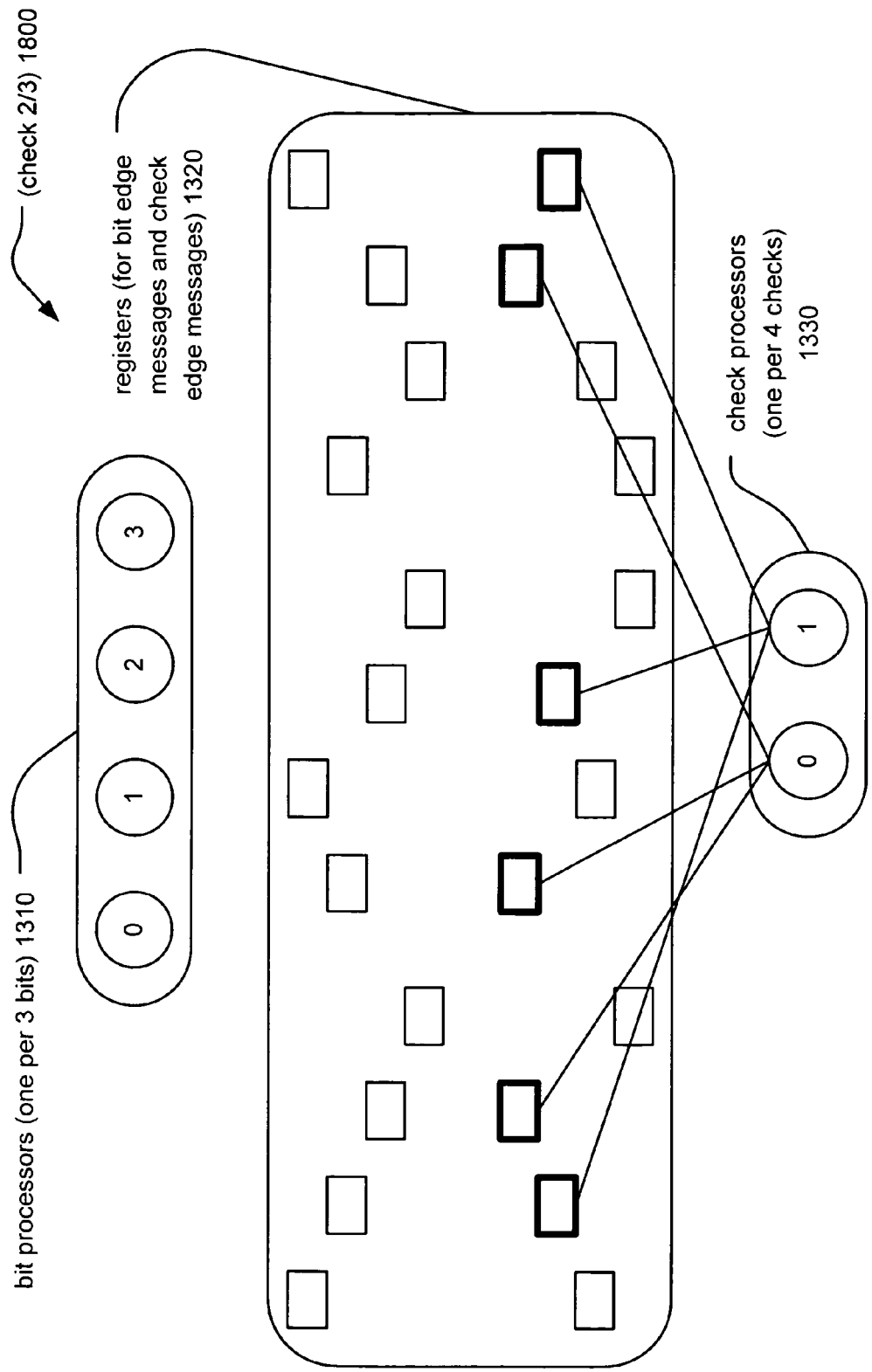
Figure 19:
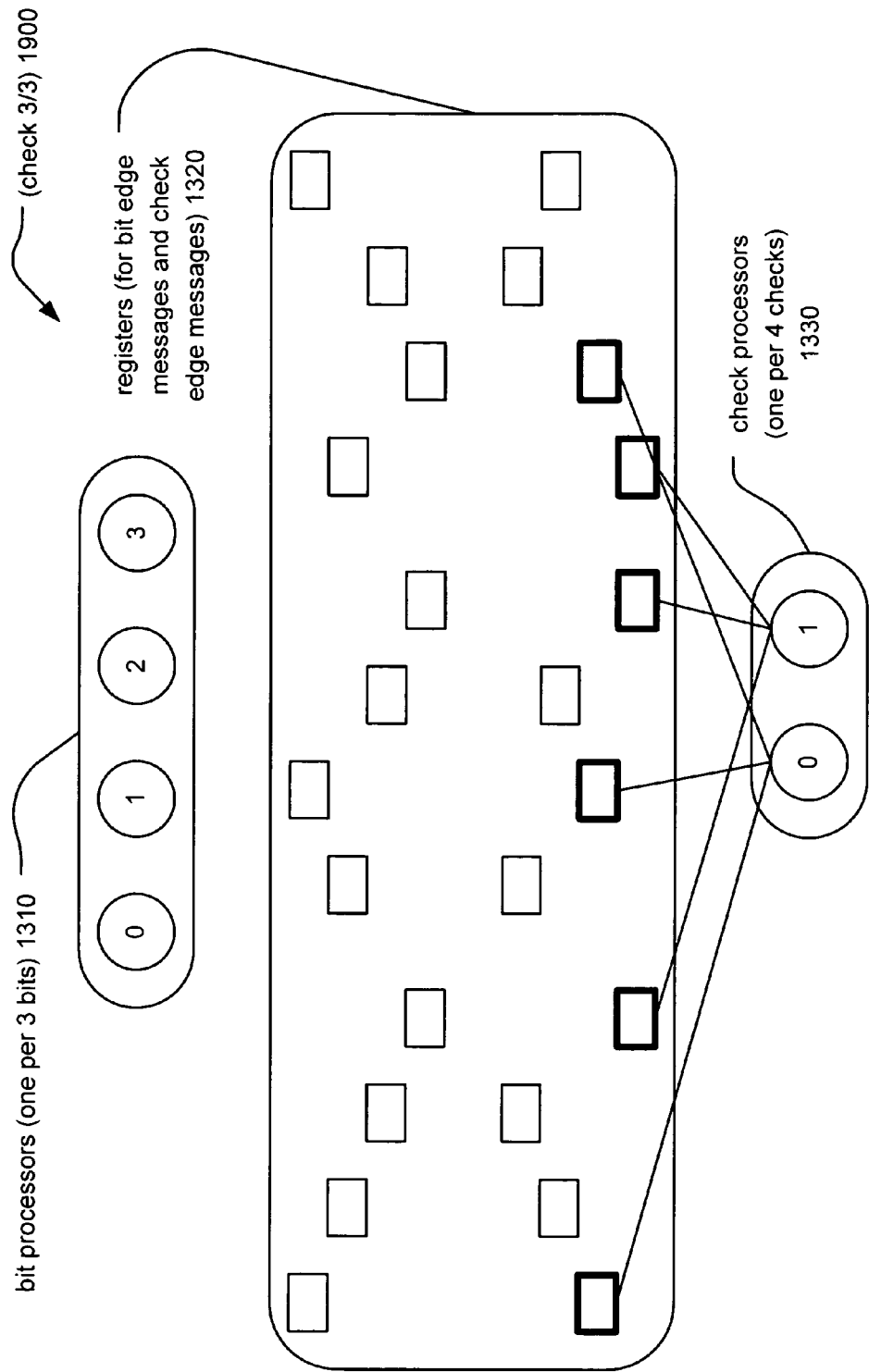

The FIG. 13, FIG. 14, and FIG. 15 (bit node processing) depict an embodiment where 3 cycles is performed within bit node processing. The FIG. 16, FIG. 17, FIG. 18, and FIG. 19 (check node processing) depict an embodiment where 4 cycles is performed within check node processing. Clearly, other variations in the numbers of bit processors and check processors can be selected in alternative embodiments without departing from the scope and spirit of the invention.

FIG. 13, FIG. 14, and FIG. 15 illustrate embodiments 1300, 1400, and 1500 of bit node processing (0/2), (1/2) and (2/2), respectively. In these embodiments, one bit processor is employed per 3 bits.

In this embodiment, 3 cycles are performed during each bit node processing step, and each bit processor communicates with $M_s$ registers. Each bit processor is selectively capable to be communicatively coupled to $3 \times M_s$ registers, this selective communicatively coupling can be achieved using MUXes as described above with reference to another embodiment. If the MUX approach is desired, then the total number of 3 to 1 MUXes required is $(P_s \times M_s \times N_s/3)$. The total number of edges that is processed per cycle is also $(M_s \times N_s \times P_s/3)$.

When considering this embodiment, it is useful to consider the low density parity check matrix, H, of the FIG. 8 to be divided into 3 separate column sections such that $1^{st}$ section (left third column section) includes the 4 columns of the left hand side of the low density parity check matrix, H, of FIG. 8. A $2^{nd}$ section (middle third column section) includes the 4 columns in the middle of the low density parity check matrix, H, of FIG. 8. A $3^{rd}$ section (right third column section) includes the 4 columns of the right hand side of the low density parity check matrix, H, of FIG. 8.

During the cycle 0/2 of the bit node processing (FIG. 13), the bit processors 1310 are communicatively coupled to the registers located in the $1^{st}$ section (left third column section) that correspond to the non-zero element locations of the 4 columns of the left hand side of the low density parity check matrix, H, of FIG. 8.

During the cycle 1/2 of the bit node processing (FIG. 14), the bit processors 1310 are communicatively coupled to the registers located in the $2^{nd}$ section (middle third column section) that correspond to the non-zero element locations of the 4 columns in the middle of the low density parity check matrix, H, of FIG. 8.

During the cycle 2/2 of the bit node processing (FIG. 15), the bit processors 1310 are communicatively coupled to the registers located in the $3^{rd}$ section (right third column section) that correspond to the non-zero element locations of the 4 columns of the right hand side of the low density parity check matrix, H, of FIG. 8.

As can be seen, one third of the bit node processing is actually being performed during each cycle in each of the FIG. 13, FIG. 14, and FIG. 15.

FIG. 16, FIG. 17, FIG. 18, and FIG. 19 illustrate embodiments 1600, 1700, 1800, and 1900 of check node processing (0/3), (1/3), (2/3) and (3/3), respectively. In these embodiments, one check processor is employed per 4 checks.

When considering this embodiment, it is useful to consider the low density parity check matrix, H, of the FIG. 8 to be divided into 3 separate row sections such that $1^{st}$ section (top fourth row section) includes the 2 top rows of the low density parity check matrix, H, of FIG. 8. A $2^{nd}$ section (top-middle fourth row section) includes the next 2 lower rows of the low density parity check matrix, H, of FIG. 8. A $3^{rd}$ section (bottom-middle fourth row section) includes the next 2 lower rows of the low density parity check matrix, H, of FIG. 8. A $4^{th}$ section (bottom fourth row section) includes the bottom 2 rows of the low density parity check matrix, H, of FIG. 8.

In this embodiment, 4 cycles are performed during each check node processing step, and each check processor communicates with $N_s$ registers. Each check processor is selectively capable to be communicatively coupled to $4 \times N_s$ registers, this selective communicatively coupling can be achieved using MUXes as described above with reference to another embodiment. If the MUX approach is desired, then the total number of 4 to 1 MUXes required is ($P_s \times N_s \times M_s/4$). The total number of edges that is processed per cycle is also ($M_s \times N_s \times P_s/4$).

During the cycle 0/3 of the check node processing (FIG. 16), the check processors 1330 are communicatively coupled to the registers located in the $1^{st}$ section (top fourth row section) that correspond to the non-zero element locations of the 2 top rows of the low density parity check matrix, H, of FIG. 8.

During the cycle 1/3 of the check node processing (FIG. 17), the check processors 1330 are communicatively coupled to the registers located in the $2^{nd}$ section (top-middle fourth row section) that correspond to the non-zero element locations of the next 2 lower rows of the low density parity check matrix, H, of FIG. 8.

During the cycle 2/3 of the check node processing (FIG. 18), the check processors 1330 are communicatively coupled to the registers located in the $3^{rd}$ section (bottom-middle fourth row section) that correspond to the non-zero element locations of the next 2 lower rows of the low density parity check matrix, H, of FIG. 8.

During the cycle 3/3 of the check node processing (FIG. 19), the check processors 1330 are communicatively coupled to the registers located in the $4^{th}$ section (bottom fourth row section) that correspond to the non-zero element locations of the bottom 2 rows of the low density parity check matrix, H, of FIG. 8.

As can be seen, one fourth of the bit node processing is actually being performed during each cycle in each of the FIG. 16, FIG. 17, FIG. 18, and FIG. 19.

Figure 20:
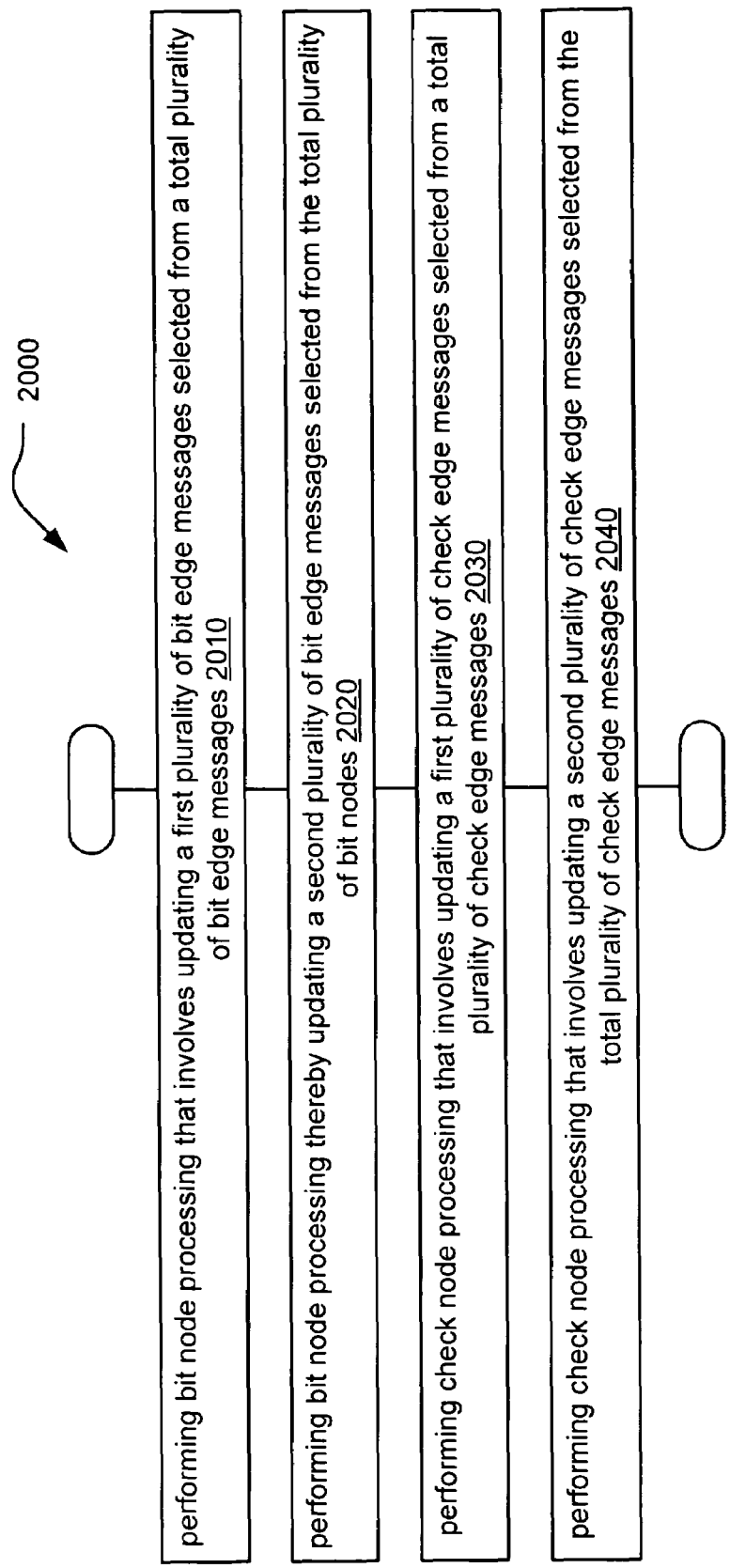
FIG. 20 illustrates an embodiment of a method for performing bit node processing and check node processing.

FIG. 20 illustrates an embodiment of a method 2000 for performing bit node processing and check node processing. The method 2000 begins by performing bit node processing that involves updating a first plurality of bit edge messages selected from a total plurality of bit edge messages, as shown in a block 2010. The method 2000 then continues by performing bit node processing thereby updating a second plurality of bit edge messages selected from the total plurality of bit nodes, as shown in a block 2020. In a block 2030, the method 2000 operates by performing check node processing that involves updating a first plurality of check edge messages selected from a total plurality of check edge messages, and the method 2000 operates by performing check node processing that involves updating a second plurality of check edge messages selected from the total plurality of check edge messages, as shown in a block 2040.

The method 2000 is operable to perform bit node processing and check node processing to assist in the error correction decoding processing of an LDPC coded signal. By performing only some of the bit node processing and some of the check node processing at a time, respectively, the method 2000 can be implemented to achieve optimization of other certain parameters including the processing resources required when performing such a method. As an example, only a fraction of the requisite processing resources needs to be allocated when compared to doing all of each or the bit node processing and some of the check node processing at the same time, respectively. That is to say, certain other embodiments perform all of the bit node processing at the same time, and all of the check node processing at the same time. While this embodiment shows at least two pluralities of bit edge messages and at least two pluralities of check edge messages being processed, it is noted that the total plurality of bit edge messages can be partitioned into an arbitrary number of pluralities of bit edge messages, and the total plurality of check edge messages can be partitioned into an arbitrary number of pluralities of check edge messages without departing from the scope and spirit of the invention. A designer is provided a great degree of freedom when choosing the number of groups into which the bit edge messages and the check edge messages is to be partitioned. It is also noted that each of the bit edge messages and the check edge messages need not be partitioned into the same number of groups. That is to say, the bit edge messages can be partitioned into N groups which the check edge messages can be partitioned into M groups.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
 a plurality of bit processors that is operable to:
  during a first time, perform bit node processing that involves updating a first plurality of bit edge messages selected from a total plurality of bit edge messages; and
  during a second time, perform bit node processing thereby updating a second plurality of bit edge messages selected from the total plurality of bit nodes; and
 a plurality of check processors that is operable to:
  during a third time, perform check node processing that involves updating a first plurality of check edge messages selected from a total plurality of check edge messages; and
  during a fourth time, perform check node processing that involves updating a second plurality of check edge messages selected from the total plurality of check edge messages; and
 wherein the total plurality of bit edge messages and the total plurality of check edge messages selectively connect between a plurality of bit nodes and a plurality of check nodes of an LDPC (Low Density Parity Check) bipartite graph that corresponds to an LDPC code.

2. The apparatus of claim 1, wherein:
 N is an integer;
 the total plurality of bit edge messages includes 2N bit edge messages;
 the plurality of bit processors includes N bit processors;
 M is an integer;
 the total plurality of check edge messages includes 2M check edge messages; and
 the plurality of check processors includes M check processors.

3. The apparatus of claim 1, wherein:
 during a fifth time, the plurality of bit processors is operable to perform bit node processing thereby updating a third plurality of bit edge messages selected from the total plurality of bit edge messages;
 during a sixth time, the plurality of check processors is operable to perform check node processing that involves updating a third plurality of check edge messages selected from the total plurality of check edge messages;
 N is an integer;
 the total plurality of bit edge messages includes 3N bit edge messages;

the plurality of bit processors includes N bit processors;
M is an integer;
the total plurality of check edge messages includes 3M check edge messages; and
the plurality of bit processors includes M bit processors.

4. The apparatus of claim 1, wherein:
the LDPC code is characterized by an LDPC matrix that includes a plurality of permutation matrices;
each row of a permutation matrix of the plurality of permutation matrices includes one non-zero value; and
each column of the permutation matrix of the plurality of permutation matrices includes one non-zero value.

5. The apparatus of claim 1, further comprising:
a first plurality of registers;
a second plurality of registers; and
a MUX (Multiplexor) that is operable to:
    during the first time, communicatively couple a bit processor of the plurality of bit processors to the first plurality of registers; and
    during the second time, communicatively couple the bit processor of the plurality of bit processors to the second plurality of registers.

6. The apparatus of claim 1, further comprising:
a first plurality of registers;
a second plurality of registers; and
a MUX (Multiplexor) that is operable to:
    during the third time, communicatively couple a check processor of the plurality of check processors to the first plurality of registers; and
    during the fourth time, communicatively couple the check processor of the plurality of check processors to the second plurality of registers.

7. The apparatus of claim 1, wherein:
a bit processor of the plurality of bit processors employs a first processing circuitry and a second processing circuitry; and
a check processor of the plurality of check processors employs the first processing circuitry and a third processing circuitry.

8. The apparatus of claim 1, wherein:
when updating a bit edge message of the first plurality of bit edge messages, a bit processor of the plurality of bit processors performs a first calculation and a second calculation; and
when updating a check edge message of the first plurality of check edge messages, a check processor of the plurality of check processors performs the first calculation and a third calculation.

9. The apparatus of claim 1, wherein:
the LDPC code is a regular LDPC code or an irregular LDPC code.

10. The apparatus of claim 1, wherein:
the apparatus is a decoder that is operable to perform error correction decoding of an LDPC coded signal to generate a best estimate of an information bit that has been encoded into the LDPC coded signal.

11. An apparatus, comprising:
a plurality of bit processors that is operable to:
    during a first time, perform bit node processing that involves updating a first plurality of bit edge messages selected from a total plurality of bit edge messages; and
    during a second time, perform bit node processing thereby updating a second plurality of bit edge messages selected from the total plurality of bit nodes; and
a plurality of check processors that is operable to:
    during a third time, perform check node processing that involves updating a first plurality of check edge messages selected from a total plurality of check edge messages; and
    during a fourth time, perform check node processing that involves updating a second plurality of check edge messages selected from the total plurality of check edge messages; and
a first plurality of registers;
a second plurality of registers;
a first MUX (Multiplexor) that is operable to:
    during the first time, communicatively couple a bit processor of the plurality of bit processors to the first plurality of registers; and
    during the second time, communicatively couple the bit processor of the plurality of bit processors to the second plurality of registers;
a second MUX that is operable to:
    during the third time, communicatively couple a check processor of the plurality of check processors to at least one register of the first plurality of registers; and
    during the fourth time, communicatively couple the check processor of the plurality of check processors to at least one register of the second plurality of registers; and
wherein the total plurality of bit edge messages and the total plurality of check edge messages selectively connect between a plurality of bit nodes and a plurality of check nodes of an LDPC (Low Density Parity Check) bipartite graph that corresponds to an LDPC code.

12. The apparatus of claim 11, wherein:
N is an integer;
the total plurality of bit edge messages includes 2N bit edge messages;
the plurality of bit processors includes N bit processors;
M is an integer;
the total plurality of check edge messages includes 2M check edge messages; and
the plurality of check processors includes M check processors.

13. The apparatus of claim 11, wherein:
during a fifth time, the plurality of bit processors is operable to perform bit node processing thereby updating a third plurality of bit edge messages selected from the total plurality of bit edge messages;
during a sixth time, the plurality of check processors is operable to perform check node processing that involves updating a third plurality of check edge messages selected from the total plurality of check edge messages;
N is an integer;
the total plurality of bit edge messages includes 3N bit edge messages;
the plurality of bit processors includes N bit processors;
M is an integer;
the total plurality of check edge messages includes 3M check edge messages; and
the plurality of bit processors includes M bit processors.

14. The apparatus of claim 11, wherein:
a bit processor of the plurality of bit processors employs a first processing circuitry and a second processing circuitry; and
a check processor of the plurality of check processors employs the first processing circuitry and a third processing circuitry.

15. The apparatus of claim 11, wherein:

when updating a bit edge message of the first plurality of bit edge messages, a bit processor of the plurality of bit processors performs a first calculation and a second calculation; and when updating a check edge message of the first plurality of check edge messages, a check processor of the plurality of check processors performs the first calculation and a third calculation.

16. The apparatus of claim 11, wherein:

the LDPC code is a regular LDPC code or an irregular LDPC code.

17. The apparatus of claim 11, wherein:

the apparatus is a decoder that is operable to perform error correction decoding of an LDPC coded signal to generate a best estimate of an information bit that has been encoded into the LDPC coded signal.

18. A method, comprising:

during a first time, performing bit node processing that involves updating a first plurality of bit edge messages selected from a total plurality of bit edge messages;

during a second time, performing bit node processing thereby updating a second plurality of bit edge messages selected from the total plurality of bit nodes;

during a third time, performing check node processing that involves updating a first plurality of check edge messages selected from a total plurality of check edge messages; and during a fourth time, performing check node processing that involves updating a second plurality of check edge messages selected from the total plurality of check edge messages, wherein the total plurality of bit edge messages and the total plurality of check edge messages selectively connect between a plurality of bit nodes and a plurality of check nodes of an LDPC (Low Density Parity Check) bipartite graph that corresponds to an LDPC code.

19. The method of claim 18, further comprising:

during a fifth time, performing bit node processing thereby updating a third plurality of bit edge messages selected from the total plurality of bit edge messages; and during a sixth time, performing check node processing that involves updating a third plurality of check edge messages selected from the total plurality of check edge messages.

20. The method of claim 18, wherein:

when updating a bit edge message of the first plurality of bit edge messages, performing a first calculation and a second calculation; and when updating a check edge message of the first plurality of check edge messages, performing the first calculation and a third calculation.

* * * * *